United States Patent
Song et al.

(10) Patent No.: US 11,121,184 B2
(45) Date of Patent: *Sep. 14, 2021

(54) ORGANIC ELECTROLUMINESCENT DEVICE

(71) Applicant: KUNSHAN NEW FLAT PANEL DISPLAY TECHNOLOGY CENTER CO., LTD, Jiangsu (CN)

(72) Inventors: Gao Song, Kunshan (CN); Liu Song, Kunshan (CN); Zhao Fei, Kunshan (CN)

(73) Assignee: Kunshan New Flat Panel Display Technology Center Co., Ltd., Jiangsu (CN)

(*) Notice: Subject to any disclaimer, the term of this patent is extended or adjusted under 35 U.S.C. 154(b) by 289 days.

This patent is subject to a terminal disclaimer.

(21) Appl. No.: 15/779,988

(22) PCT Filed: Nov. 30, 2016

(86) PCT No.: PCT/CN2016/107985
§ 371 (c)(1),
(2) Date: May 30, 2018

(87) PCT Pub. No.: WO2017/107749
PCT Pub. Date: Jun. 29, 2017

(65) Prior Publication Data
US 2018/0358414 A1    Dec. 13, 2018

(30) Foreign Application Priority Data
Dec. 25, 2015 (CN) .......................... 201510990548.X

(51) Int. Cl.
*H01L 27/32* (2006.01)
*H01L 51/50* (2006.01)

(52) U.S. Cl.
CPC ........ *H01L 27/3211* (2013.01); *H01L 51/504* (2013.01); *H01L 51/5016* (2013.01); *H01L 51/5056* (2013.01); *H01L 51/5084* (2013.01)

(58) Field of Classification Search
CPC ............. H01L 27/3206; H01L 27/3211; H01L 51/5012–5016; H01L 51/50–56
See application file for complete search history.

(56) References Cited

U.S. PATENT DOCUMENTS

2005/0057150 A1    3/2005  Kim et al.
2006/0105201 A1    5/2006  Lee et al.
(Continued)

FOREIGN PATENT DOCUMENTS

CN    1599527 A    3/2005
CN    1773746 A    5/2006
(Continued)

OTHER PUBLICATIONS

Cho, et al. "A universal host material for high external quantum efficiency close to 25% and long lifetime in green fluorescent and phosphorescent OLEDs." Advanced Materials 26.24 (2014): 4050-4055.*

(Continued)

*Primary Examiner* — William E McClain
(74) *Attorney, Agent, or Firm* — Taft Stettinius & Hollister LLP; Stephen F. Rost

(57) ABSTRACT

An organic electroluminescent device adopts a TADF material as a first host material (6) of a green light unit (302) to sensitize a green phosphorescent material serving as a first guest material (7). A portion of triplet excitons are converted into singlet excitons through inverse gap crossing, and thus decrease of the triplet exciton concentration results in narrowing of the recombination region, thereby preventing the triplet excitons from diffusing into a blue light layer (4) to (Continued)

emit light, so as to realize a green light spectrum containing no blue light component. And because an energy level difference between red light and blue light is relatively large, carriers in a red light unit cannot be easily transferred to the blue light layer, and therefore it is not easy for a blue light component to appear in a red light spectrum. Accordingly, the light-emitting spectrums of red/green subpixels in the organic electroluminescent device with a shared blue light layer do not contain blue light, thereby effectively broaden the range of applicable combinations of luminescent materials and improving the display performance of the device. Moreover, a hole-blocking layer is not required, and thus the structure of the device is effectively simplified, and the operation voltage is lowered; in the meantime, the process difficulty is reduced, and the product yield is increased, thereby reducing the production cost.

3 Claims, 1 Drawing Sheet

(56) References Cited

U.S. PATENT DOCUMENTS

| | | | |
|---|---|---|---|
| 2009/0302742 | A1 | 12/2009 | Komori et al. |
| 2010/0133994 | A1 | 6/2010 | Song et al. |
| 2011/0128262 | A1 | 6/2011 | Chaji et al. |
| 2012/0223633 | A1 | 9/2012 | Yoshinaga et al. |
| 2013/0323867 | A1 | 12/2013 | Yoshinaga et al. |
| 2015/0129849 | A1* | 5/2015 | Kwong ............... H01L 51/0059 257/40 |
| 2015/0270494 | A1 | 9/2015 | Xu et al. |
| 2016/0105201 | A1 | 4/2016 | Lee et al. |
| 2016/0181545 | A1 | 6/2016 | Stoessel et al. |
| 2016/0322582 | A1 | 11/2016 | Qiu et al. |
| 2017/0352813 | A1* | 12/2017 | Duan ............... H01L 51/5004 |
| 2018/0175294 | A1* | 6/2018 | Duan ............... C07D 417/10 |
| 2018/0375058 | A1 | 12/2018 | Kawamura et al. |
| 2019/0081265 | A1 | 3/2019 | Seo |

FOREIGN PATENT DOCUMENTS

| | | | |
|---|---|---|---|
| CN | 102655164 | A | 9/2012 |
| CN | 102714213 | A | 10/2012 |
| CN | 103094992 | A | 4/2014 |
| CN | 104693185 | A * | 6/2015 |
| CN | 104716268 | A | 6/2015 |
| CN | 104725298 | A * | 6/2015 |
| CN | 104835916 | A | 8/2015 |
| EP | 2980876 | A1 | 2/2016 |
| JP | 2012186021 | A | 9/2012 |
| JP | 2013179291 | A | 9/2013 |
| JP | 2015065225 | A | 4/2015 |
| KR | 1020060113007 | A | 11/2006 |
| KR | 1020080085001 | A | 9/2008 |
| KR | 1020130071852 | A | 7/2013 |
| KR | 1020150018716 | A | 2/2015 |
| KR | 1020150122754 | A | 11/2015 |
| KR | 1020180090273 | | 8/2018 |
| TW | 201526337 | A | 7/2015 |
| WO | 2014194971 | A1 | 12/2014 |
| WO | 2017099160 | A1 | 6/2017 |
| WO | 2014194971 | A1 | 12/2017 |

OTHER PUBLICATIONS

Masui, et al. "Analysis of exciton annihilation in high-efficiency sky-blue organic light-emitting diodes with thermally activated delayed fluorescence." Organic electronics 14.11 (2013): 2721-2726.*

Taneda, et al. "High efficiency thermally activated delayed fluorescence based on 1,3, 5-tris (4-(diphenylamino) phenyl)-2, 4, 6-tricyanobenzene." Chemical Communications 51.24 (2015): 5028-5031.*

Zhang, et al. "Anthraquinone-based intramolecular charge-transfer compounds: computational molecular design, thermally activated delayed fluorescence, and highly efficient red electroluminescence." Journal of the American Chemical Society 136.52 (2014): 18070-18081.*

Lee, et al. "Luminous butterflies: efficient exciton harvesting by benzophenone derivatives for full-color delayed fluorescence OLEDs." Angewandte Chemie International Edition 53.25 (2014): 6402-6406.*

Duan, "34.2: Invited Paper: Highly Efficient and Stable OLEDs Using Hosts with Thermally Activated Delayed Fluorescence." SID Symposium Digest of Technical Papers. vol. 46. No. 1. 2015.*

Uoyama, et al. "Highly efficient organic light-emitting diodes from delayed fluorescence." Nature 492.7428 (2012): 234-238.*

Korean Office Action; Korea Patent Application No. 10-2018-7016281, dated Dec. 16, 2019, 13 pgs.

English translation of Korean Office Action; Korea Patent Application No. 10-2018-7016281, dated Dec. 16, 2019, 11 pgs.

Chinese First Office Action for CN102655164A, State Intellectual Property Office of the People's Republic of China, dated Feb. 24, 2018, 6 pages.

Elsevier; Synthetic Metals 91 (1997) pp. 9-13; "The stacked OLED(SOLED) : a new type of organic device for achieving high-resolution full-color displays"; Center for Photonics and Optoelectronic Materials (POEM); Department of Electrical Engineering, Princeton University, Princeton NJ 08544, Department of Chemistry; University of Southern California, Los Angeles, CA.

Journal "Royal Society of Chemistry"; Journal of Materials Chemistry C; "Towards ideal electrophosphorescent devices with low dopant concentrations: the key role of triplet up-conversion"; Published on Sep. 2, 2014; Dongdong Zhang, Lian: Duan, Deqiang Zhang and Yong Qiu; pp. 1-7.

Taiwan First Office Action for TW20152S337A; Intellectual Property Office of Taiwan; 7 pages.

Office Action of Japan application No. 2018-529259.

Office Action of Europe Application No. 16877560.9, 4 pages.

European Patent Office, Munich Germany; "Extended European Search Report"; dated Aug. 14, 2018; pp. 1-5.

Office Action of Japan application No. 2018-529259, 2 pages.

* cited by examiner

ORGANIC ELECTROLUMINESCENT DEVICE

This application is a U.S. national stage application under 35 U.S.C. § 371 of PCT International Application Serial No. PCT/CN2016/107985, which has an international filing date of Nov. 30, 2016, designates the United States of America, and claims the benefit of CN Application No. 201510990548.X, which was filed on Dec. 25, 2015, the disclosures of which are hereby expressly incorporated by reference in their entirety.

JOINT RESEARCH AGREEMENT

The entities including KUNSHAN NEW FLAT PANEL DISPLAY TECHNOLOGY CENTER CO., LTD.; KUNSHAN GO-VISIONOX OPTO-ELECTRONICS CO., LTD.; and TSINGHUA UNIVERSITY, are parties to a joint research agreement that was in effect on or before the effective filing date of the claimed invention of the instant application and the claimed invention of the instant application was made as a result of activities undertaken within the scope of the joint research agreement.

TECHNICAL FIELD

The present invention relates to the field of organic electroluminescence, and in particular relates to an organic electroluminescent device and a preparation method thereof.

BACKGROUND

Organic Light-Emitting Devices (OLED) adopts organic electroluminescent material and is a type of active light-emitting device, with the advantages of low power consumption, wide color gamut and thinner volume, and has the prospect of becoming the next-generation mainstream illuminance and flat panel display technology.

Currently, the organic electroluminescent display technology has been widely used in small-sized panels such as smart phone display screens. At present, the main techniques for an organic electroluminescent display device to realize full-color display are in the following three ways: the first way is primary pixel collocation method, such as P (Pentile) collocation and IGNIS collocation (see Chinese patent CN102714213A); the second way is using color filters as in the liquid crystal display technology to realize full-color display. In addition, U.S. Princeton University has developed a device structure with stacked multiple layers of RGB organic light-emitting diodes (see "*The stacked OLED (SOLED): a new type of organic device for achieving high-resoluting full-color displays*", Synthetic Metals, 1997, Volume 91, Pages 9-13), wherein, three subpixels of RGB are stacked in a single pixel unit, each subpixel is an independent organic light-emitting diode individually driven by a respective driving circuit. In this technology, each subpixel is a structurally-complete organic light-emitting diode, two many stacked layers in a single pixel unit add to the control difficulty during the preparation process, and because each diode is individually driven by a respective driving circuit, the corresponding pixel circuit is complicated, which also adds to the process difficulty, and as a result, the reliability of the organic electroluminescent display device is prone to decline.

The color filter method needs to add a layer of color filter upon the light-exiting surface of a white organic light-emitting diode, which not only increases the production cost but also increases the thickness of the screen body. More importantly, the color filter will considerably absorb the light emitted from the OLED device and thus severely reduce the external quantum efficiency of the OLED device. In the primary pixel collocation method, each pixel is formed by an arrangement of 2-4 primary subpixels, and during manufacturing, a fine metal mask is required for preparing each subpixel, at least three deposition or transfer steps are required, with very high requirements of process precision, and as a result, in actual production, mixing of different primary colors usually occurs, which causes a problem that negatively affects the display quality. Meanwhile, in prior art, in order to prevent the problem of phosphorescent material aggregation quenching, the light-emitting layer is usually prepared by doping a host material with a guest material, which leads to a problem that holes move faster than electrons, therefore, a hole-blocking layer with adapted energy level must be provided on one side of the light-emitting layer away from the anode, so as to ensure the carriers with opposite electrical properties recombine within the light-emitting layer, which further adds to the process difficulty.

Chinese patent literature CN1599527A discloses a full-color organic electroluminescent display device, wherein a shared blue light layer is provided upon the pixel units to avoid having to provide a hole-blocking layer, thereby subtracting one mask evaporation step and effectively reducing the process cost. However, in order to ensure the light spectrums emitted from the red and green subpixels do not contain a blue light component, there usually is a limitation to the energy level of the light-emitting material. In this literature, the HOMO energy level of the blue light material is limited to be not lower than 5.5 eV, which considerably limits the selection range of the blue light material.

SUMMARY OF THE INVENTION

Thus, a technical problem to be solved by the present invention is that the range of applicable combinations of luminescent materials is small in an organic electroluminescent display device with a shared blue light layer. To solve this problem, the present invention provides an organic electroluminescent display device with a shared blue light layer that has a large range of applicable combinations of luminescent materials and meanwhile does not contain blue light in the light-emitting spectrums of its red/green subpixels.

In order to solve the above-mentioned technical problem, the present invention adopts the following technical scheme:

The present invention provides an organic electroluminescent device that comprises a first electrode, a first light-emitting layer, a second light-emitting layer and a second electrode stacked upon a substrate, wherein the first light-emitting layer comprises red light units, green light units and blue light units, which are arranged in the same layer, and the second light-emitting layer is a blue light layer;

the green light unit comprises a host material doped with a guest material, wherein the host material at least includes a Thermal Activation Delayed Fluorescence (TADF) material having an energy level difference $\Delta E_{ST}$ that is less than 0.15 eV between triplet state and singlet state.

The Thermal Activation Delayed Fluorescence material has an energy level difference that is no more than 0.10 eV between triplet state and singlet state.

The Thermal Activation Delayed Fluorescence material has donor group units and acceptor group units that are interconnected, wherein the donor group unit is formed by one or more donor groups interconnected, the acceptor group unit is formed by one or more acceptor groups interconnected.

The Thermal Activation Delayed Fluorescence material has donor group units, acceptor group units and connecting groups, wherein the donor group units and the acceptor group units are respectively connected with the connecting groups.

The acceptor group is selected from naphthyl; anthryl; phenanthryl; pyrenyl; triazinyl; benzimidazolyl; cyan; pyridyl; sulfuryl; phenanthrene imidazolyl; naphthothiazolyl; benzothiazolyl; oxadiazolyl; naphthyl substituted by at least one of C1-C6 alkyl, methoxyl, ethoxyl, phenyl and pyridyl; anthryl substituted by at least one of C1-C6 alkyl, methoxyl, ethoxyl, phenyl and pyridyl; phenanthryl substituted by at least one of C1-C6 alkyl, methoxyl, ethoxyl, phenyl and pyridyl; pyrenyl substituted by at least one of C1-C6 alkyl, methoxyl, ethoxyl, phenyl and pyridyl; triazinyl substituted by at least one of C1-C6 alkyl, methoxyl, ethoxyl, phenyl and pyridyl; benzimidazolyl substituted by at least one of C1-C6 alkyl, methoxyl, ethoxyl, phenyl and pyridyl; pyridyl substituted by at least one of C1-C6 alkyl, methoxyl, ethoxyl, phenyl and pyridyl; sulfuryl substituted by at least one of C1-C6 alkyl, methoxyl, ethoxyl, phenyl and pyridyl; phenanthrene imidazolyl substituted by at least one of C1-C6 alkyl, methoxyl, ethoxyl, phenyl and pyridyl; naphthothiazolyl substituted by at least one of C1-C6 alkyl, methoxyl, ethoxyl, phenyl and pyridyl; benzothiazolyl substituted by at least one of C1-C6 alkyl, methoxyl, ethoxyl, phenyl and pyridyl; and oxadiazolyl substituted by at least one of C1-C6 alkyl, methoxyl, ethoxyl, phenyl and pyridyl.

The acceptor group is selected from

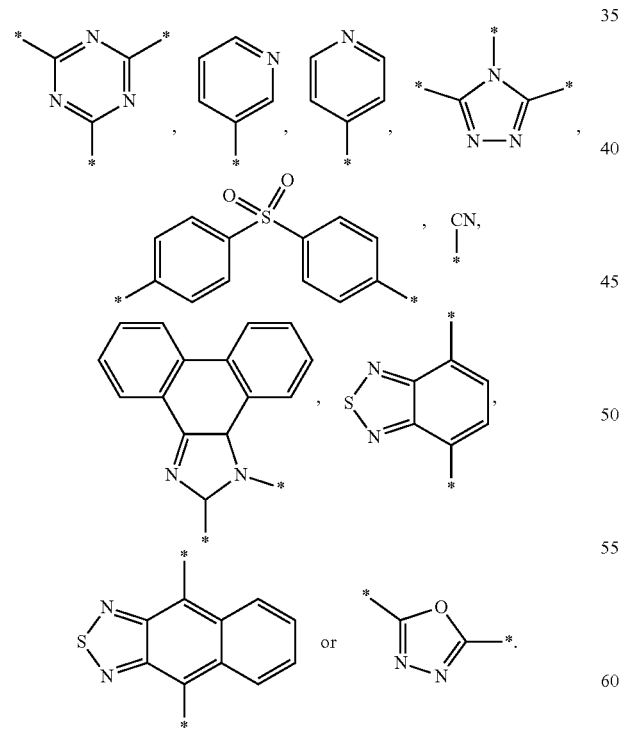

The donor group is selected from indole carbazolyl; carbazolyl; bi-carbazolyl; tri-phenylamine group; phenoxazine group; indole carbazolyl substituted by at least one of C1-C6 alkyl, methoxyl, ethoxyl and phenyl; carbazolyl substituted by at least one of C1-C6 alkyl, methoxyl, ethoxyl and phenyl; bi-carbazolyl substituted by at least one of C1-C6 alkyl, methoxyl, ethoxyl and phenyl; tri-phenylamine group substituted by at least one of C1-C6 alkyl, methoxyl, ethoxyl and phenyl; and phenoxazine group substituted by at least one of C1-C6 alkyl, methoxyl, ethoxyl and phenyl.

The donor group is selected from

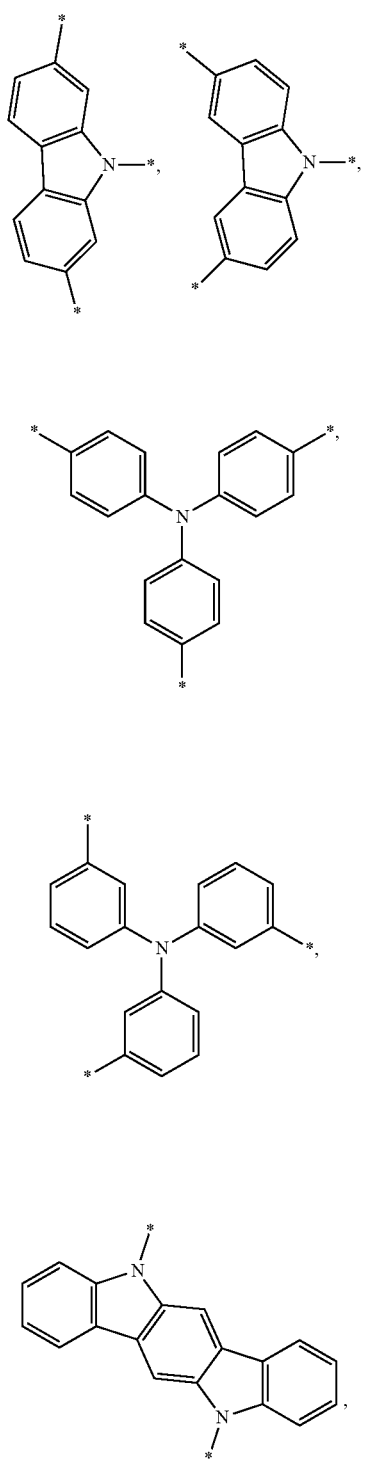

5
-continued

6
-continued

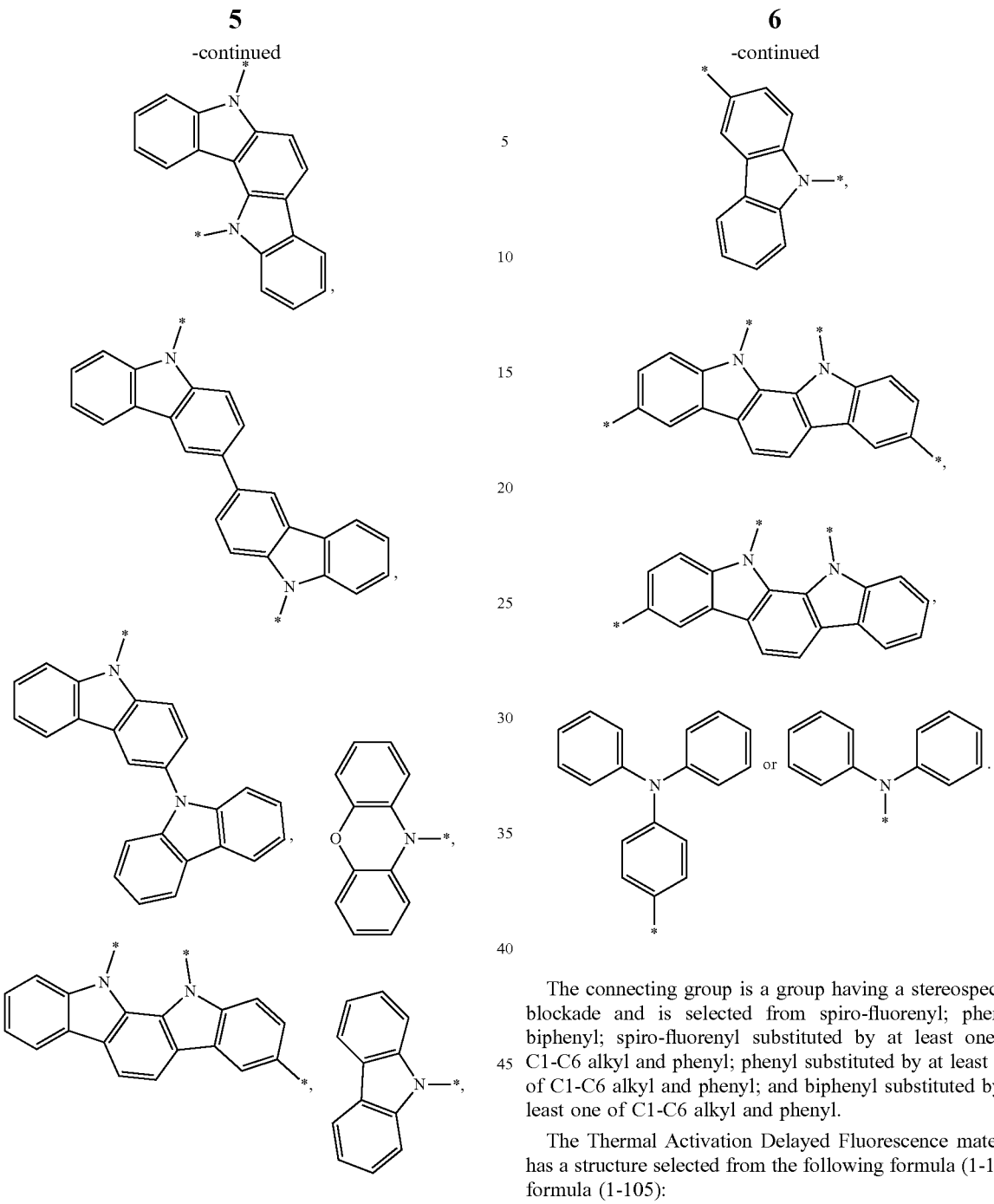

The connecting group is a group having a stereospecific blockade and is selected from spiro-fluorenyl; phenyl; biphenyl; spiro-fluorenyl substituted by at least one of C1-C6 alkyl and phenyl; phenyl substituted by at least one of C1-C6 alkyl and phenyl; and biphenyl substituted by at least one of C1-C6 alkyl and phenyl.

The Thermal Activation Delayed Fluorescence material has a structure selected from the following formula (1-1) to formula (1-105):

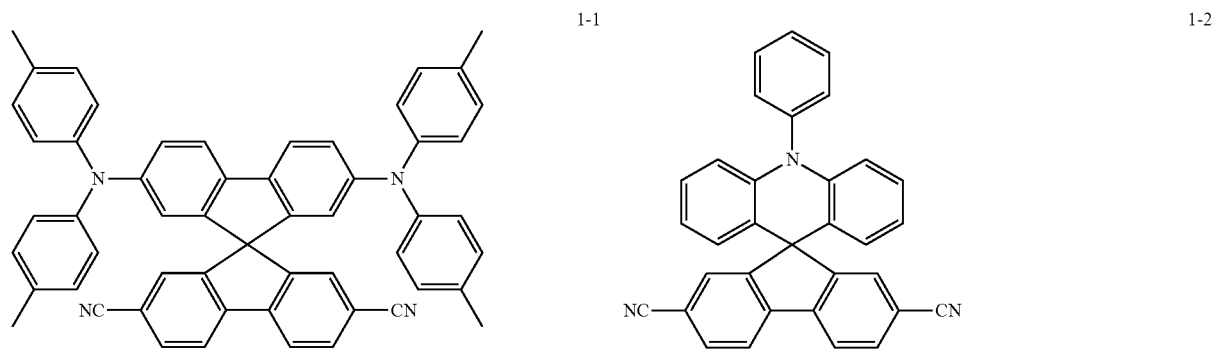

-continued
1-3
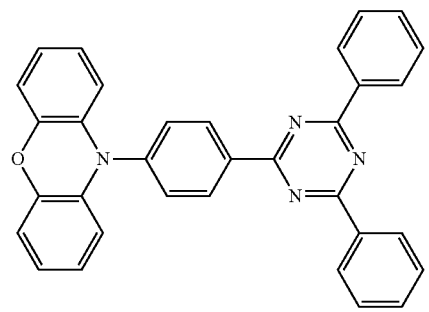
1-4
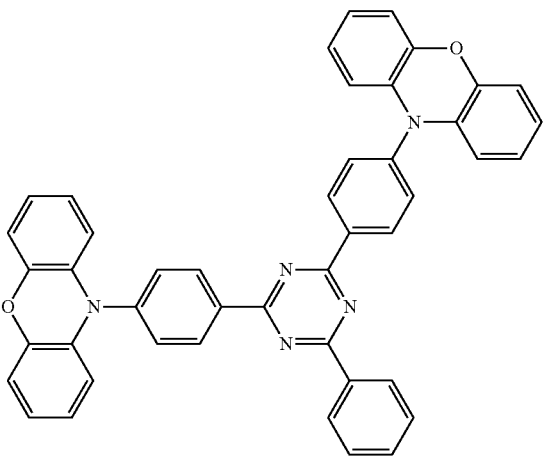
1-5
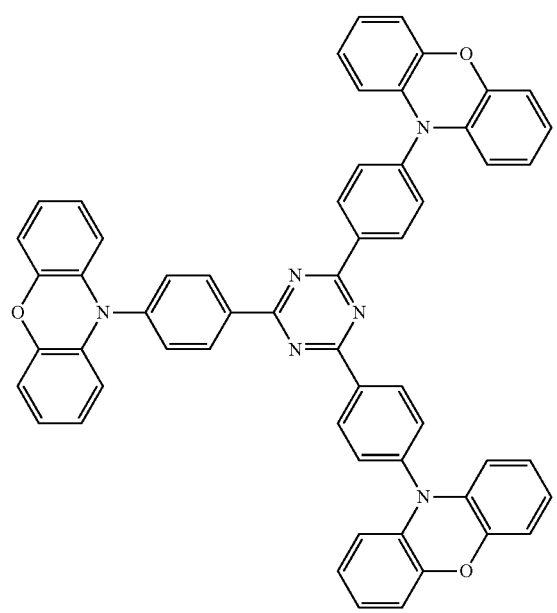
1-6
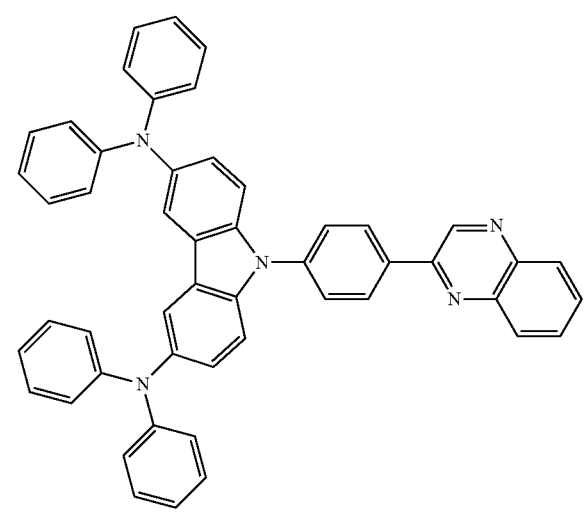
1-7
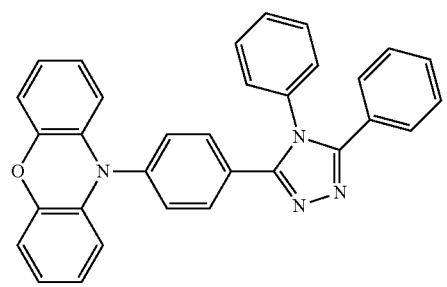
1-8
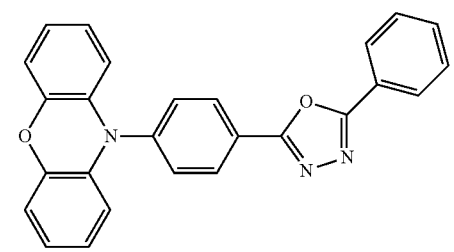
1-9
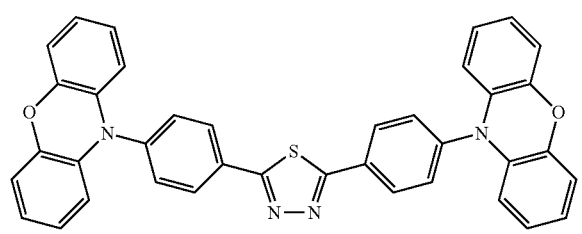
1-10
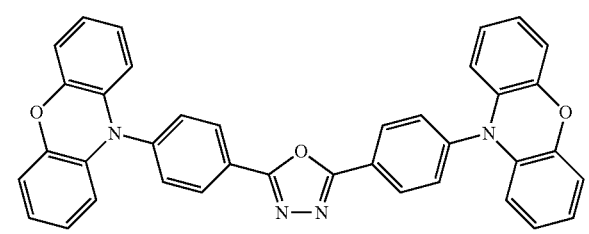

-continued
| | |
|---|---|
| 1-11 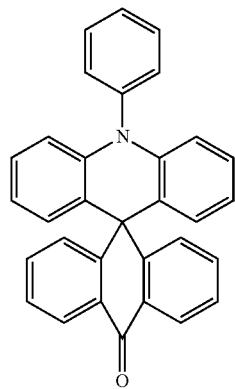 | 1-12 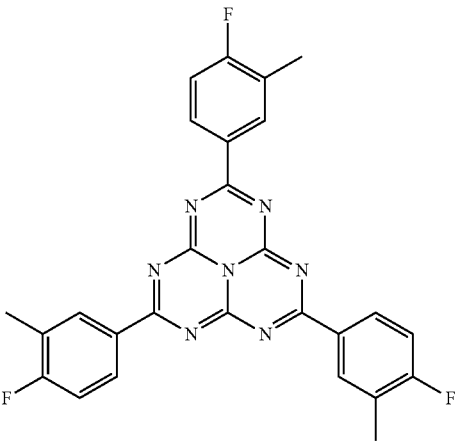 |
| 1-13 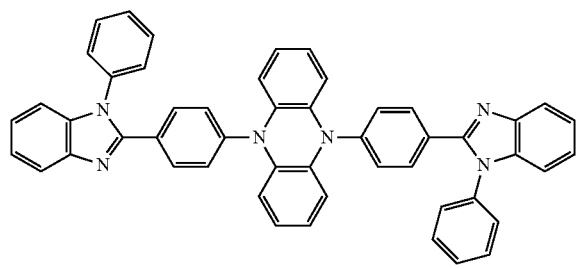 | 1-14 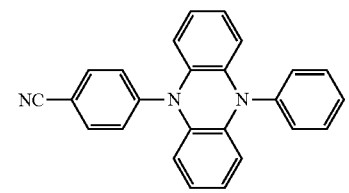 |
| 1-15 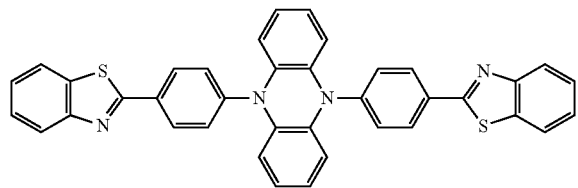 | 1-16 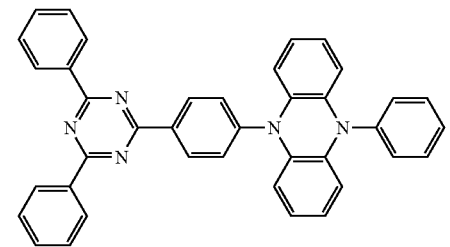 |
| 1-17 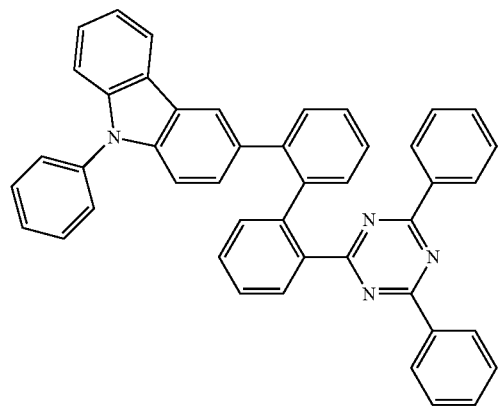 | 1-18 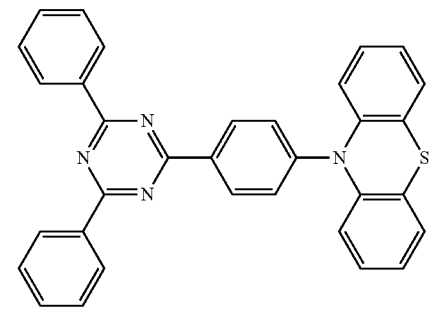 |

-continued
1-19
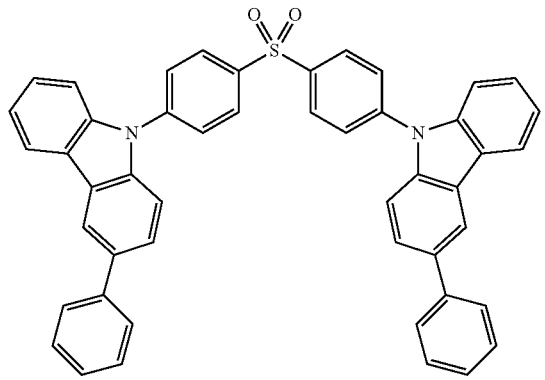
1-20
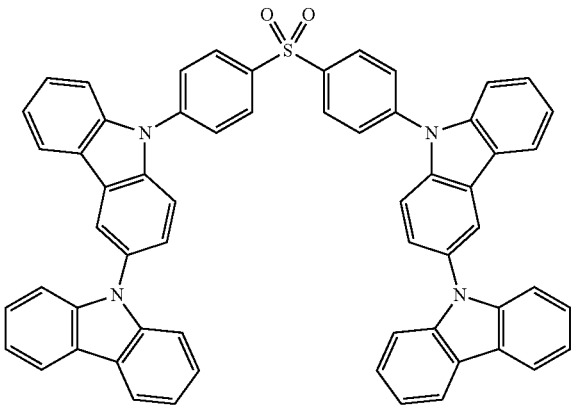
1-21
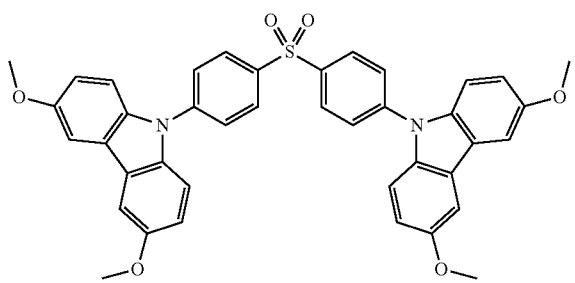
1-22
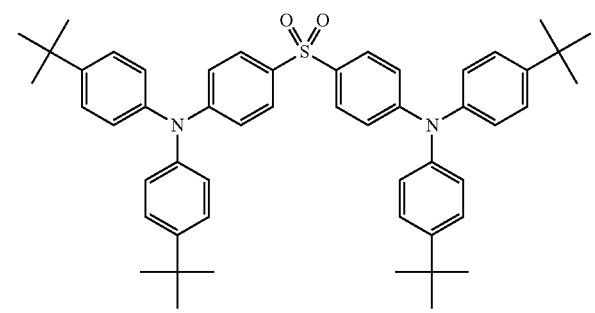
1-23
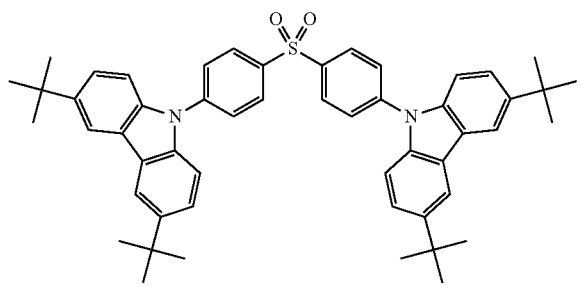
1-24
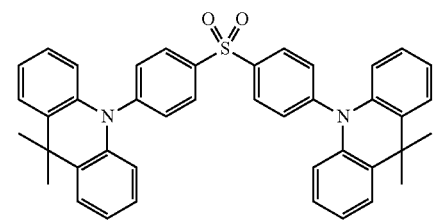
1-25
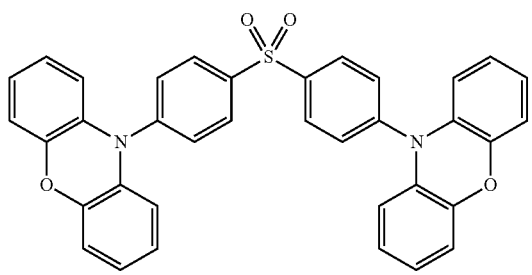
1-26
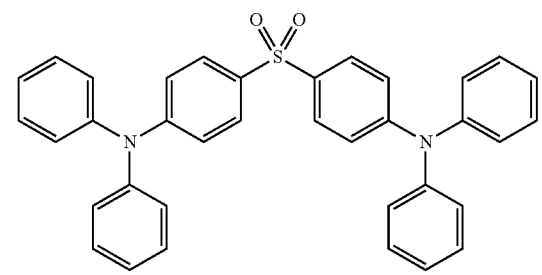
1-27
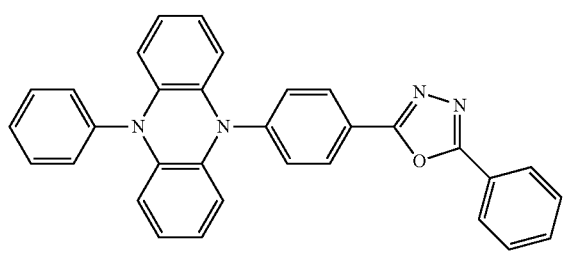
1-28
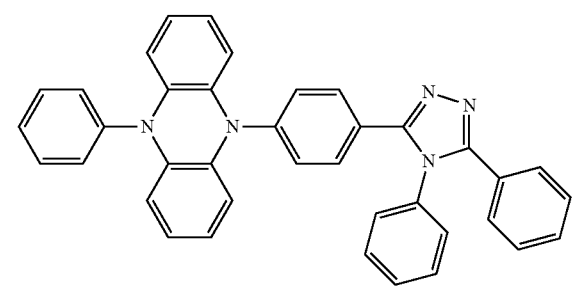

1-29
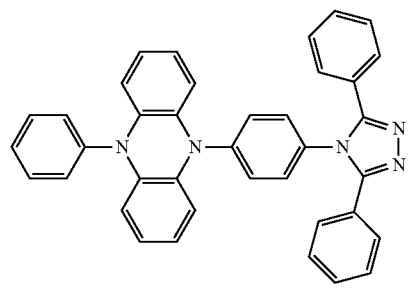
1-30
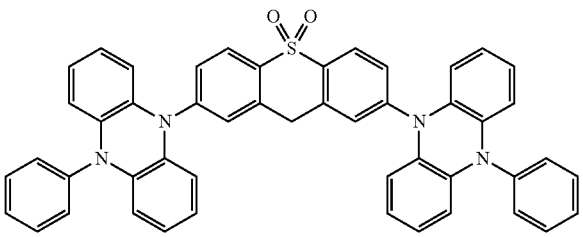
1-31
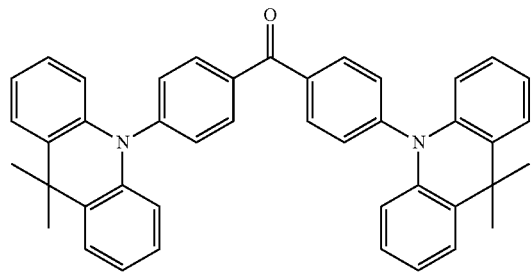
1-32
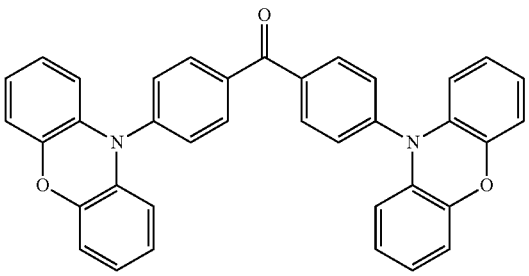
1-33
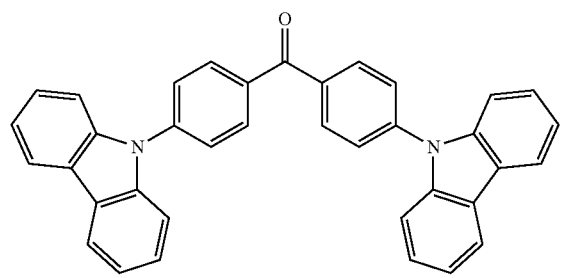
1-34
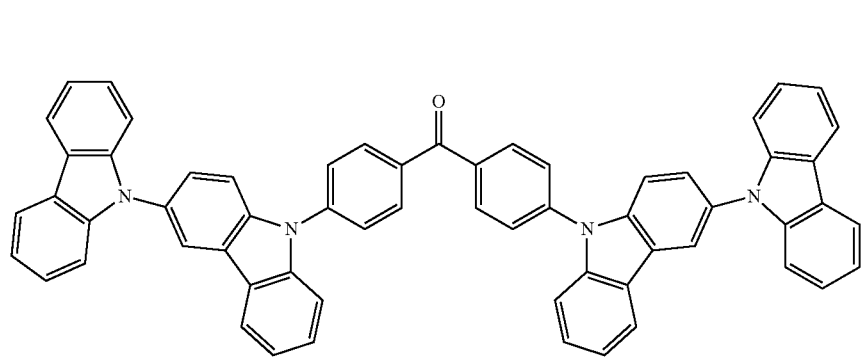
1-35
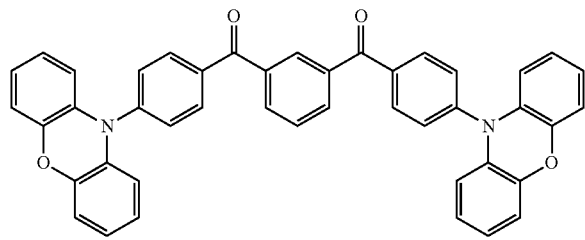
1-36
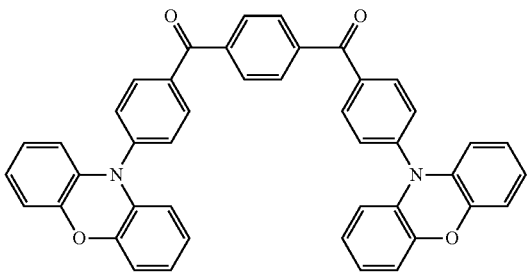

1-37
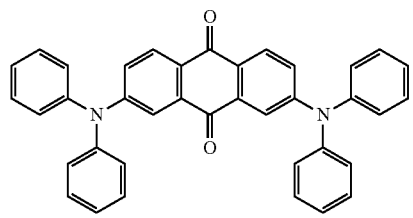
1-38
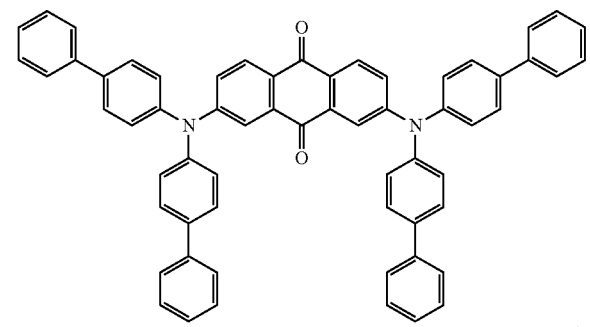
1-39
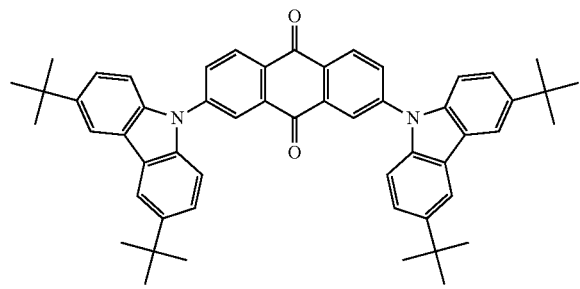
1-40
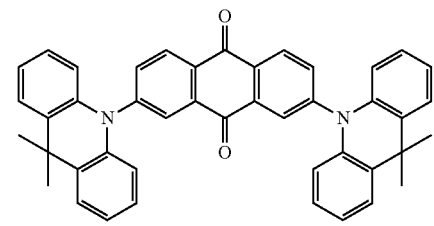
1-41
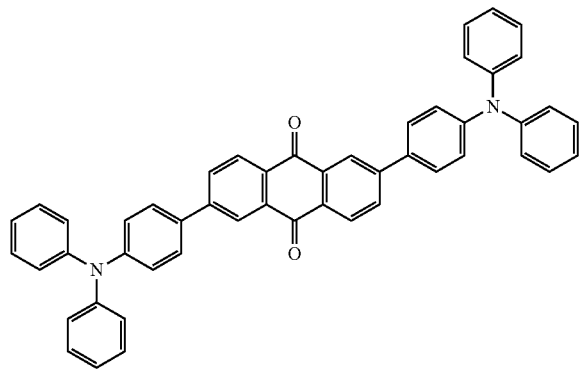
1-42
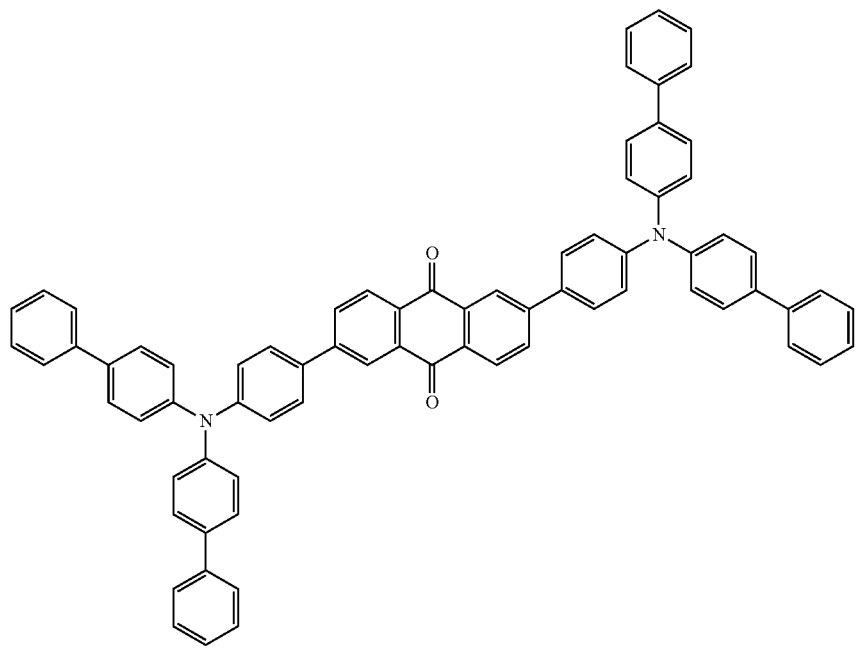

-continued
1-43
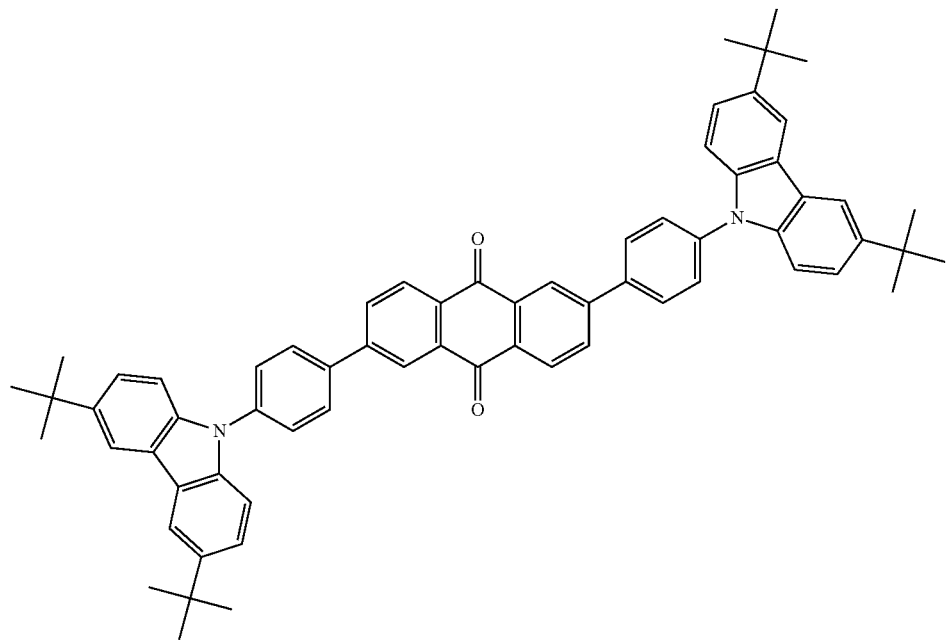
1-44 1-45
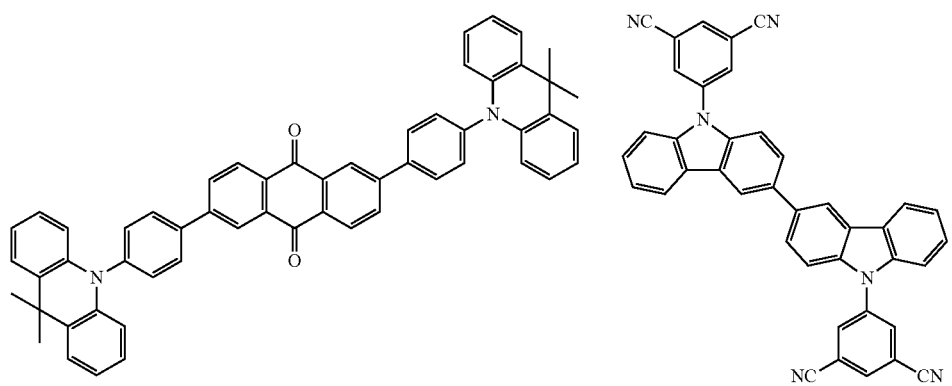
1-46 1-47
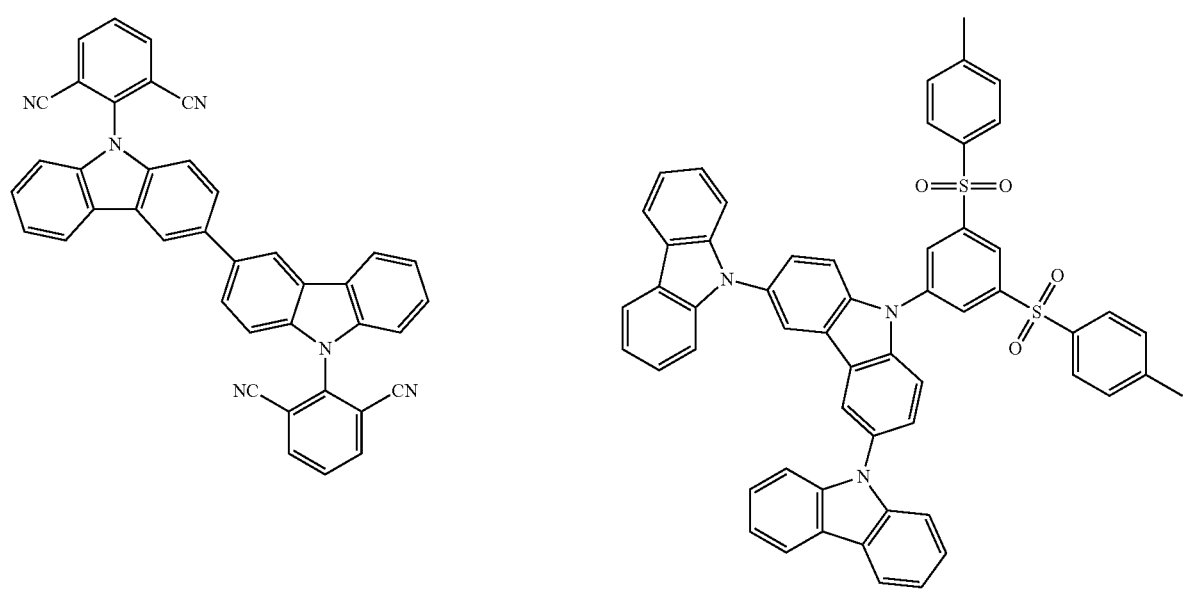

-continued
1-48
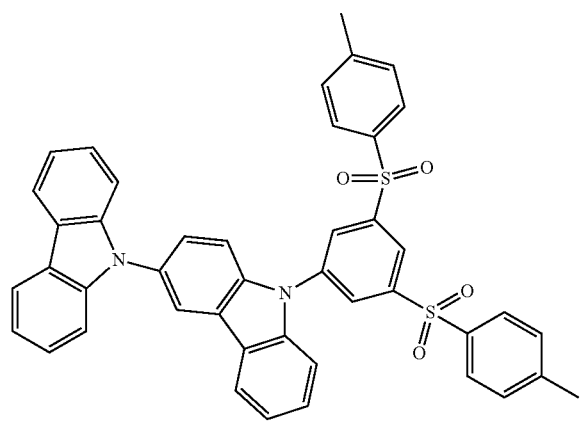
1-49
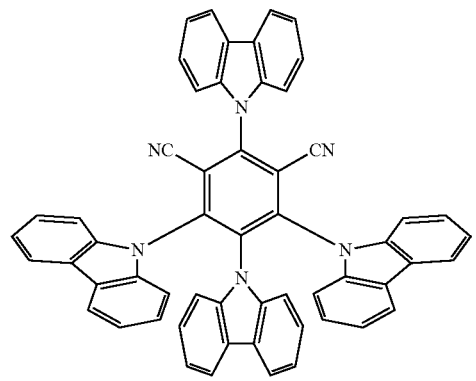
1-50
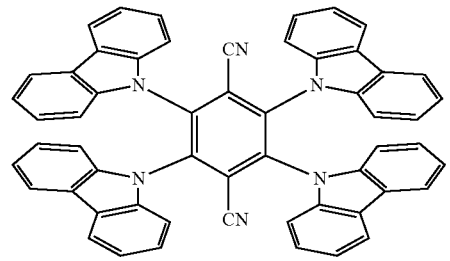
1-51
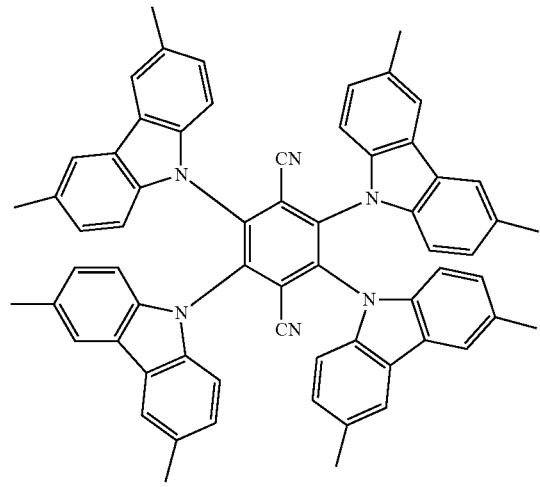
1-52
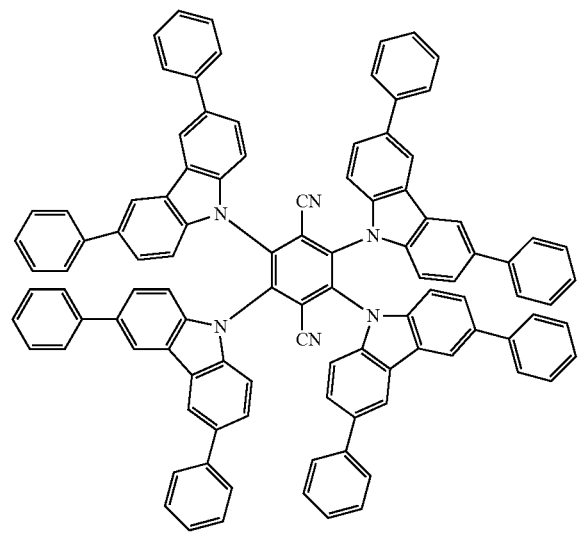
1-53
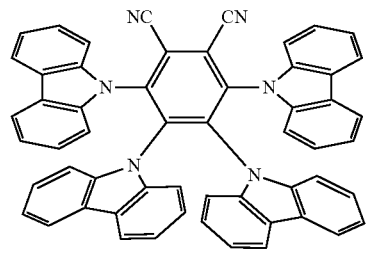

-continued
1-54
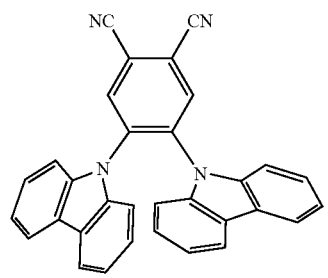
1-55
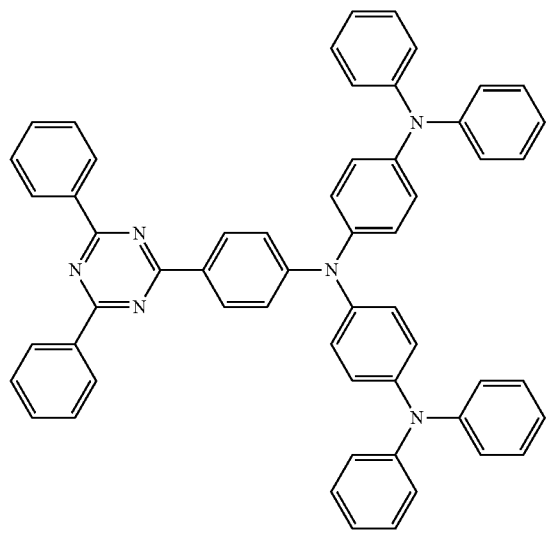
1-56
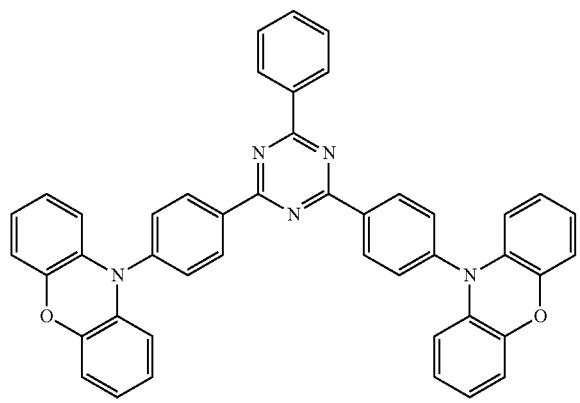
1-57
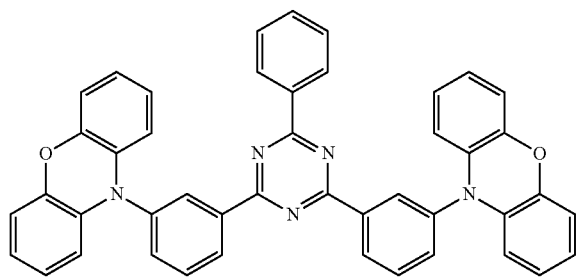
1-58
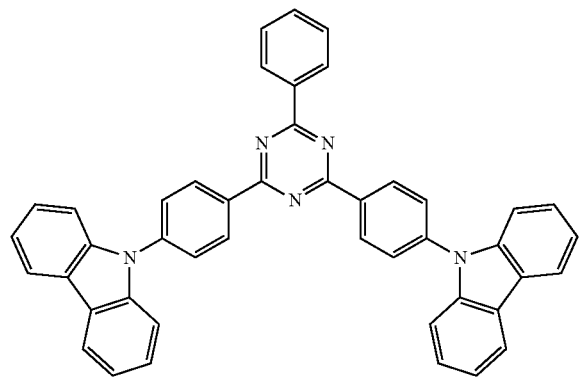
1-59
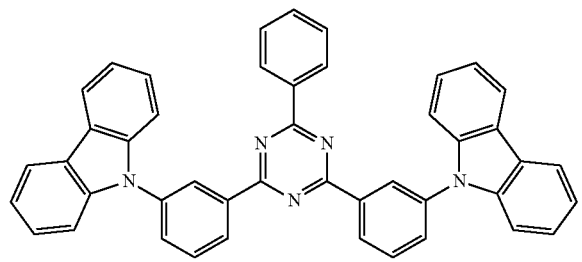

1-60
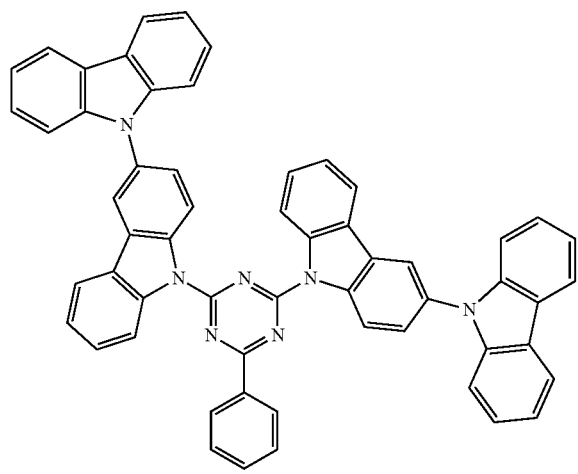
1-61
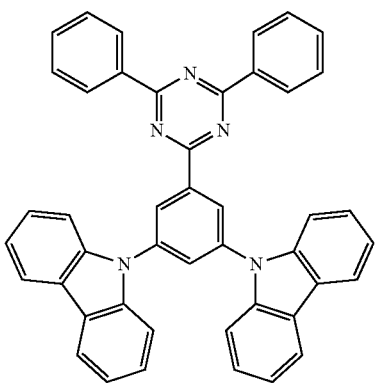
1-62
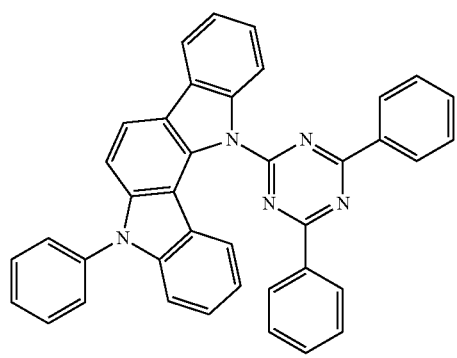
1-63
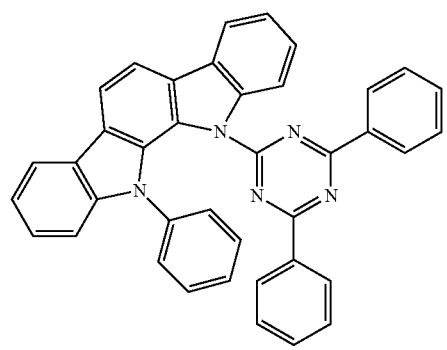
1-64
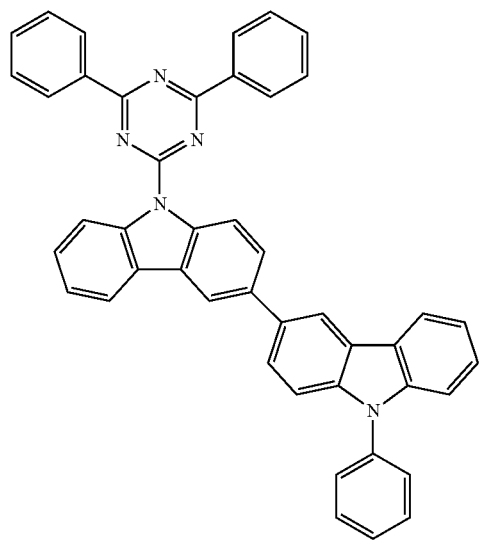
1-65
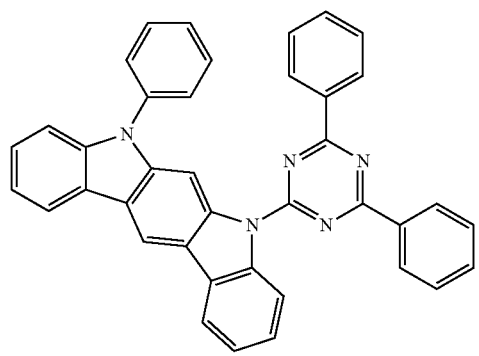

-continued
1-66
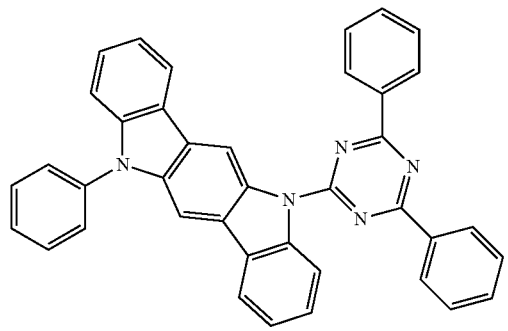
1-67
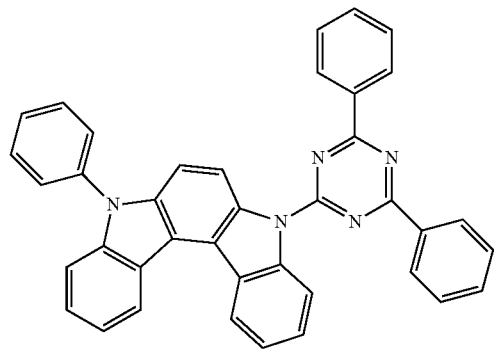
1-68
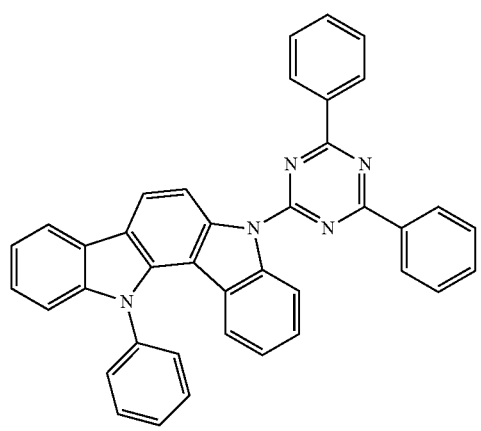
1-69
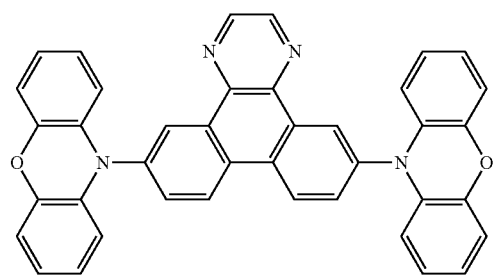
1-70
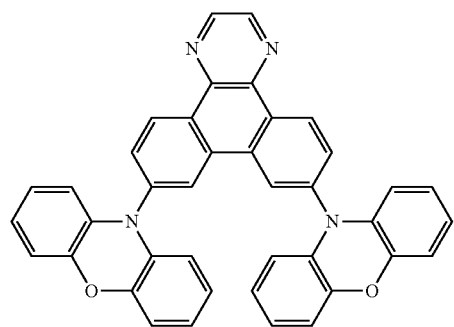
1-71
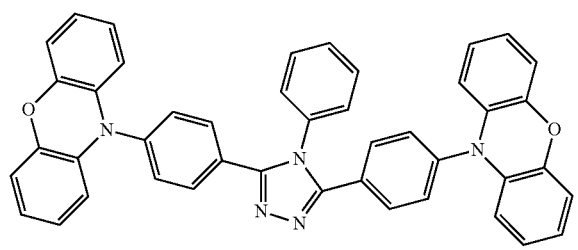

-continued
1-72
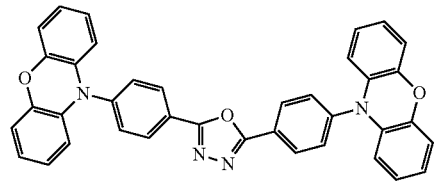
1-73
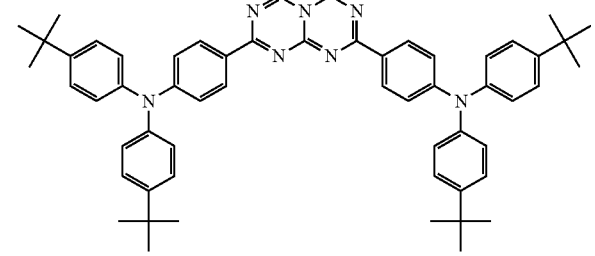
1-74
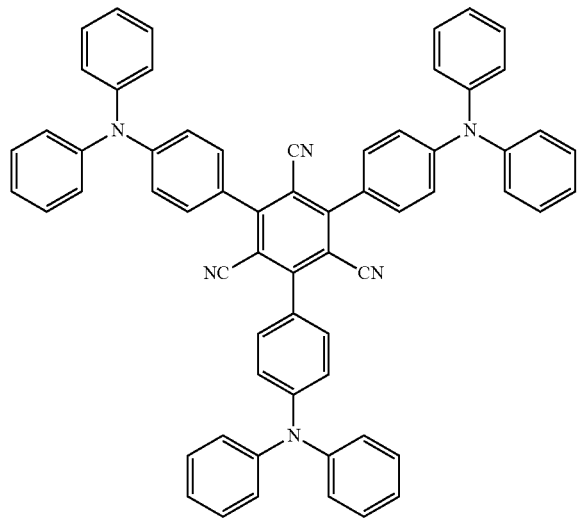
1-75
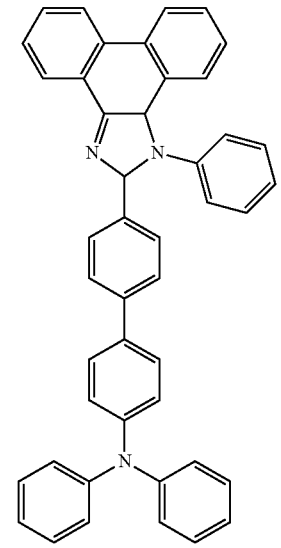
1-76
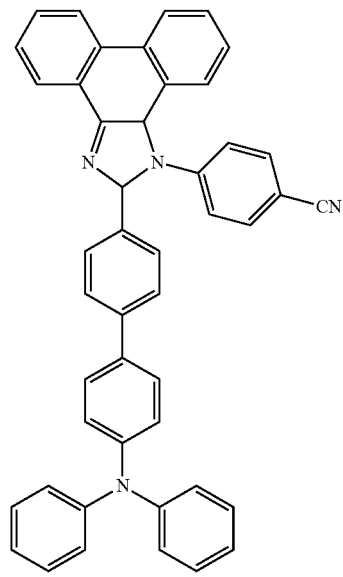
1-77
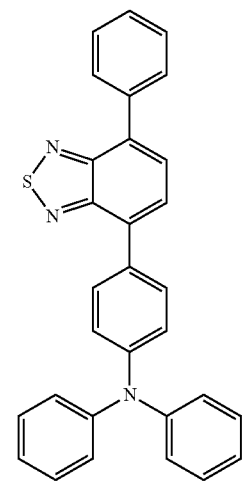

1-78
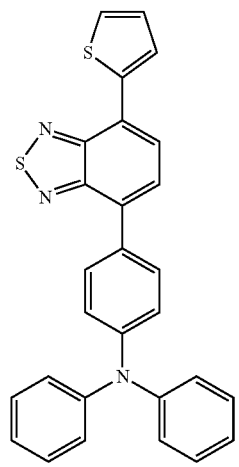
1-79
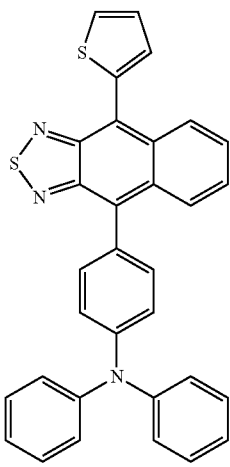
1-80
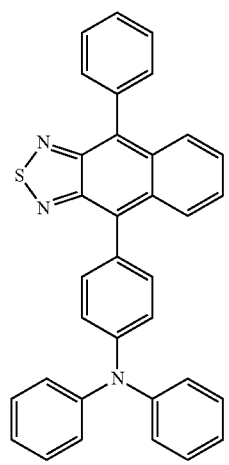
1-81
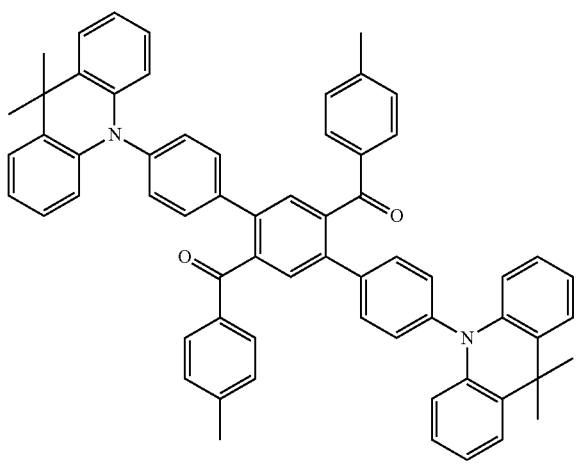
1-82
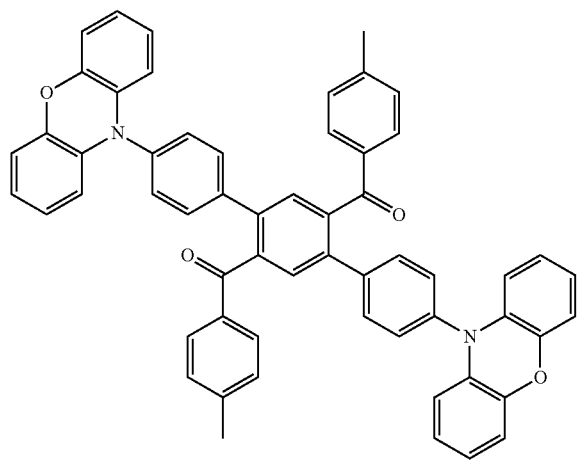
1-83
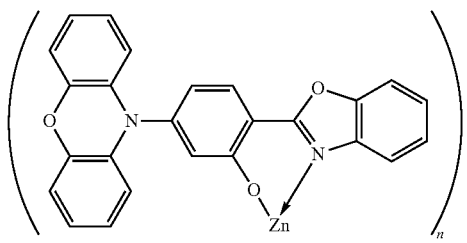

-continued
1-84
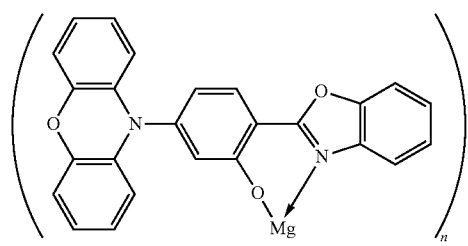
1-85
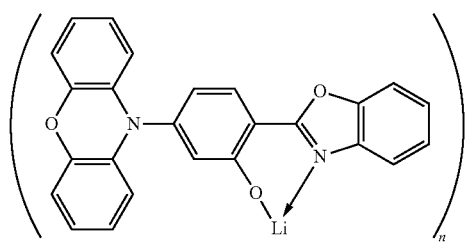
1-86
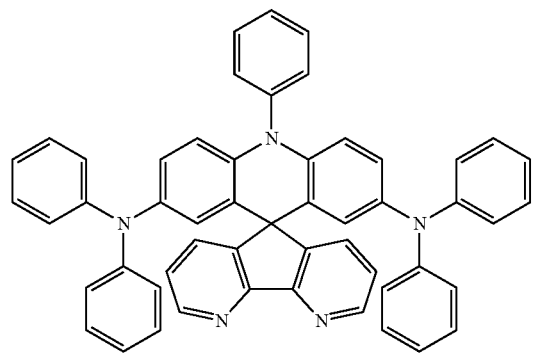
1-87
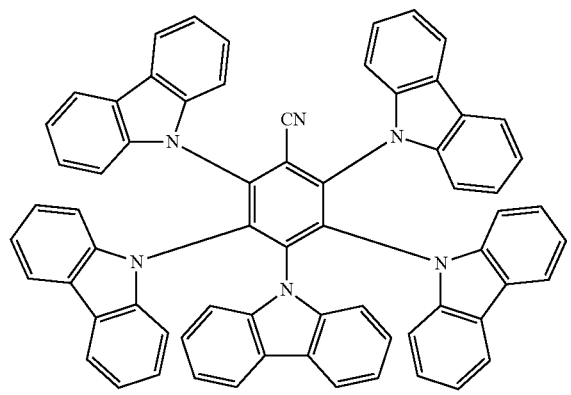
1-88
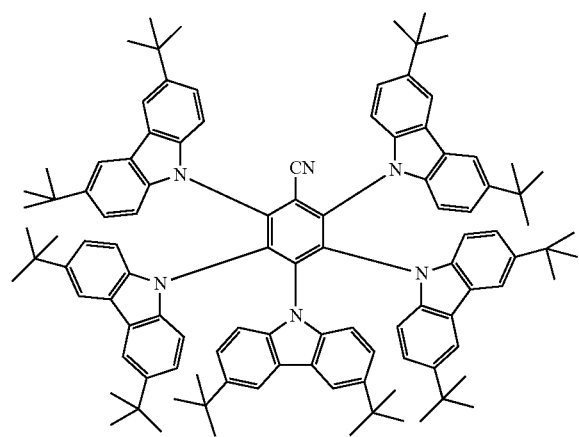

-continued
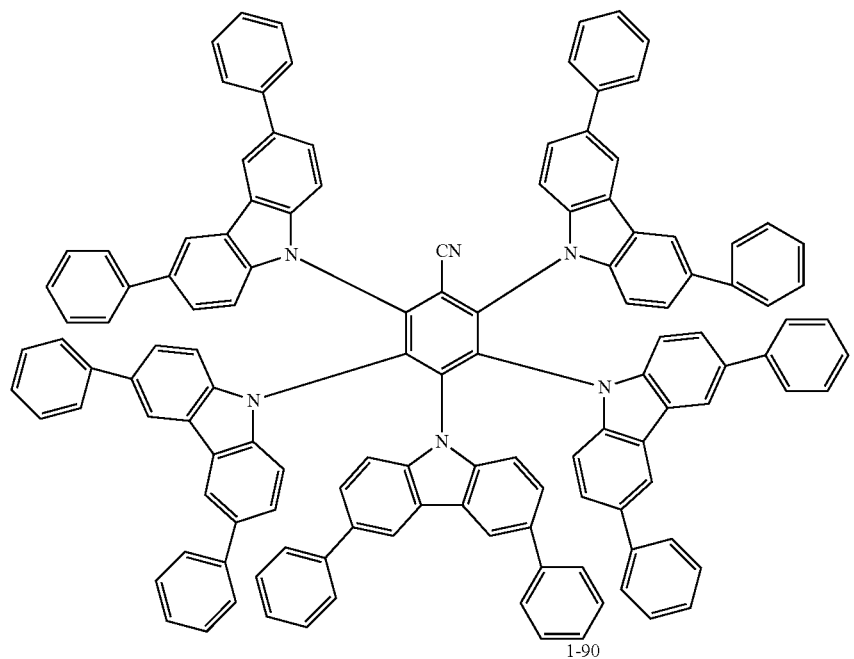
1-89
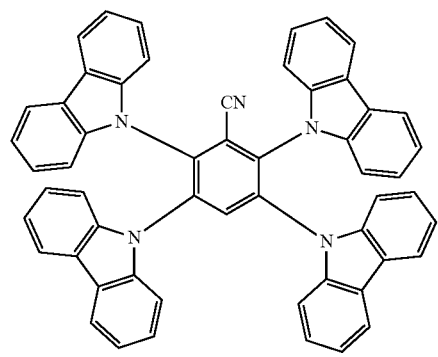
1-90
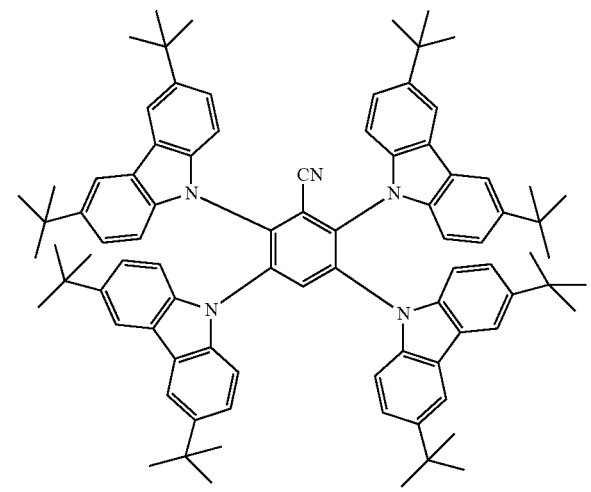
1-91
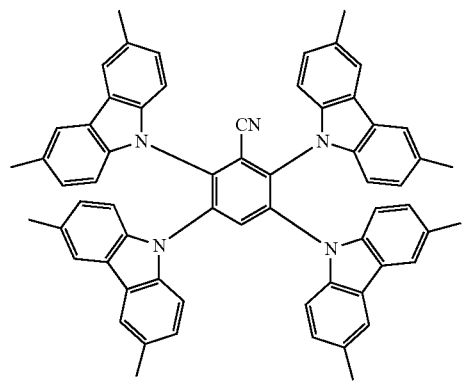
1-92
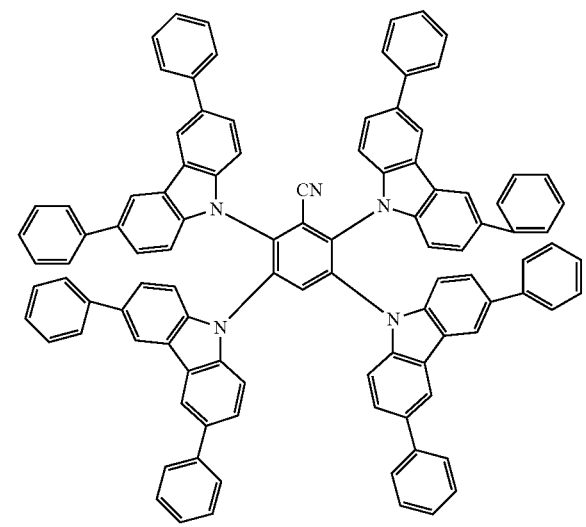
1-93

-continued
1-94
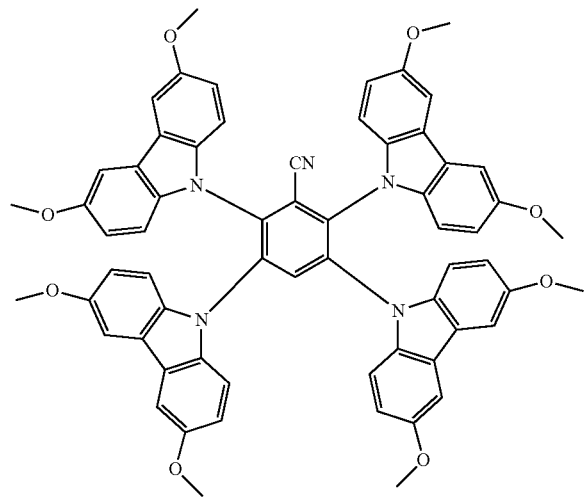
1-95
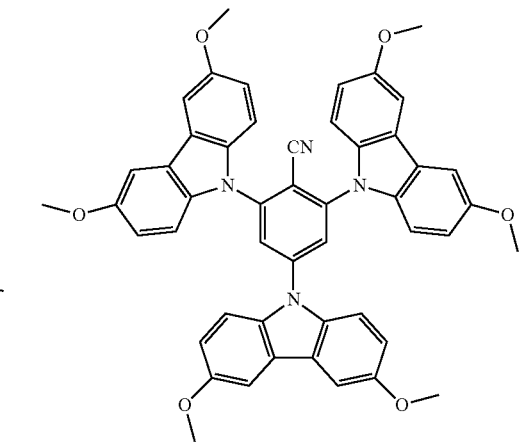
1-96
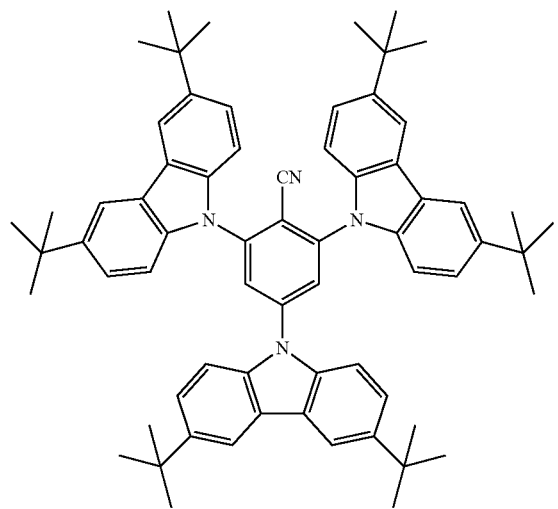
1-97
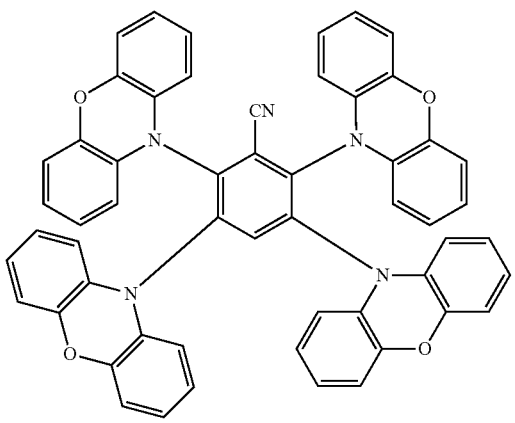
1-98
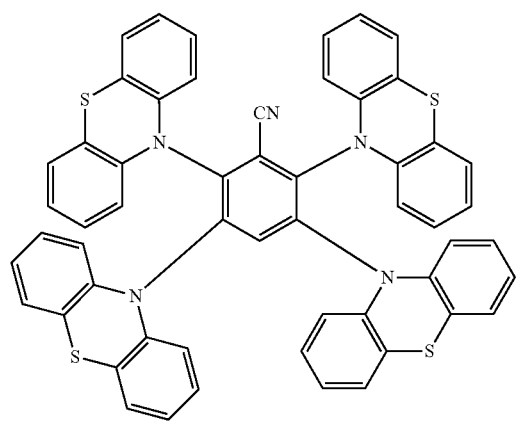
1-99
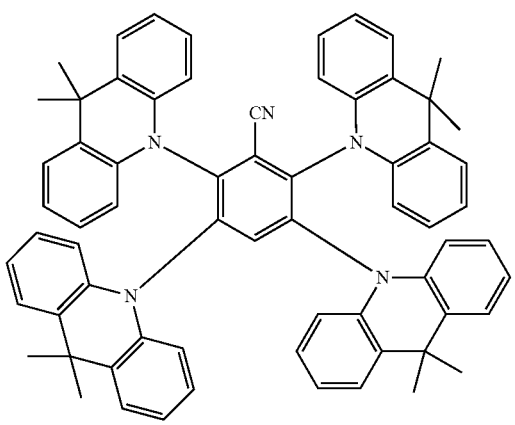

-continued 1-100

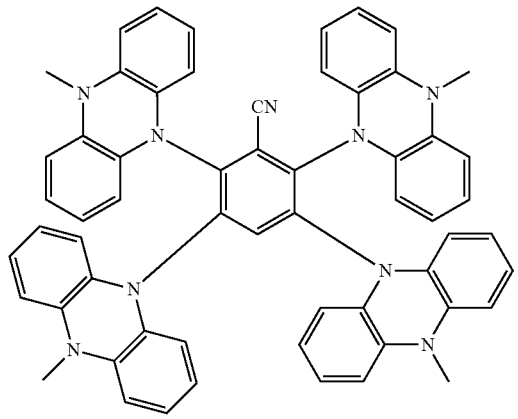

1-101

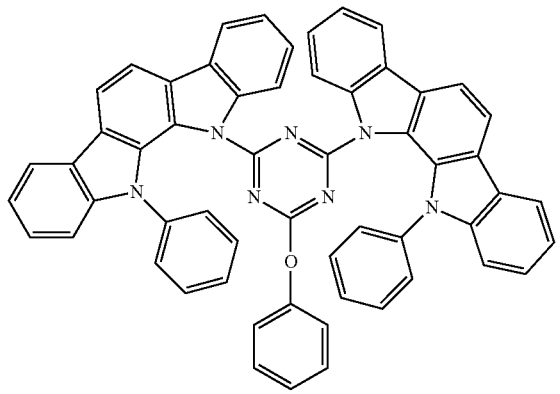

1-102

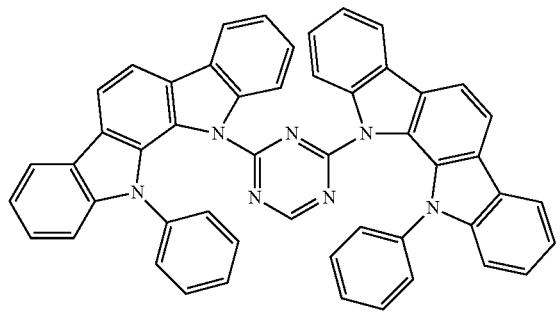

1-103

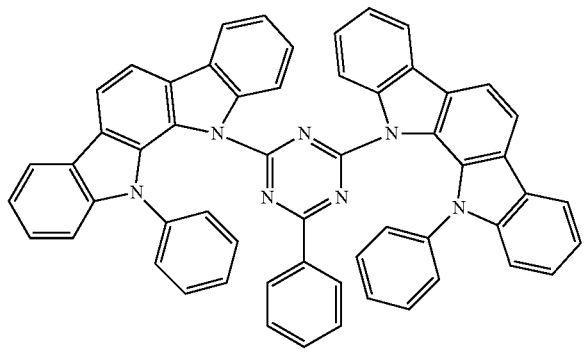

1-104

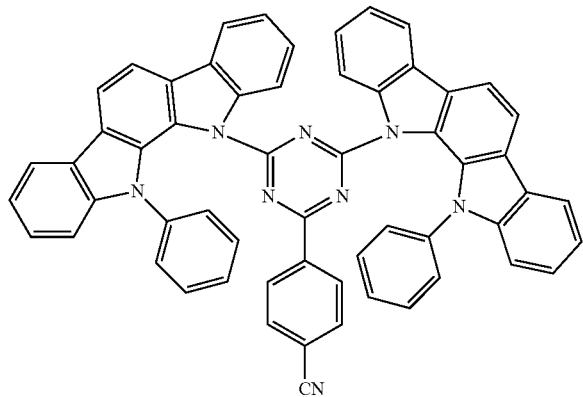

1-105

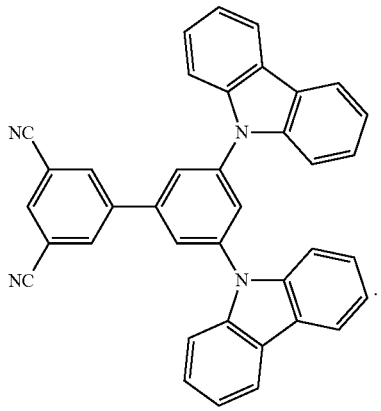

The blue light unit in the first light-emitting layer is formed by a part of the second light-emitting layer extending into the first light-emitting layer.

The red light unit comprises phosphorescent material; the blue light unit comprises fluorescent material; and the blue light layer comprises fluorescent material.

As compared to the prior art, the above-mentioned technical scheme of the present invention has the following advantages:

1. The organic electroluminescent device of the present invention comprises a first electrode, a first light-emitting layer, a second light-emitting layer and a second electrode stacked upon a substrate, wherein the first light-emitting layer comprises red light units, green light units and blue light units, which are arranged in the same layer, and the second light-emitting layer is a blue light layer; the green light unit comprises a host material doped with a guest material, wherein the host material at least includes a Thermal Activation Delayed Fluorescence (TADF) material having an energy level difference $\Delta E_{ST}$ that is less than 0.15 eV between triplet state and singlet state. As shown in FIG. 2, the organic electroluminescent device of the present invention adpots a TADF material as a first host material of the green light units to sensitize a green phosphorescent material serving as a first guest material. A portion of triplet excitons are converted into singlet excitons through inverse gap crossing, and thus decrease of the triplet exciton concentration results in narrowing of the recombination region, thereby preventing the triplet excitons from diffusing into the blue light layer to emit light, so as to realize a green light spectrum containing no blue light component. And because an energy level difference between red light and blue light is relatively large, carriers in the red light units cannot be easily transferred to the blue light layer, and therefore it is not easy for a blue light component to appear in a red light spectrum. Accordingly, the light-emitting spectrums of red/green subpixels in the organic electroluminescent device with a shared blue light layer do not contain blue light, thereby effectively broaden the range of applicable combinations of luminescent materials and improving the display performance of the device.

2. In the organic electroluminescent device of the present invention, a hole-blocking layer is not required, and thus the structure of the device is effectively simplified, and the operation voltage is lowered; in the meantime, the process difficulty is reduced, and the product yield is increased, so that the production cost is reduced.

BRIEF DESCRIPTION OF THE DRAWINGS

In order to make the content of the present invention easier to be understood clearly, hereinafter, the present invention is further described in detail according to specific embodiments of the present invention with reference to the accompanying drawings, wherein.

Figure 1:
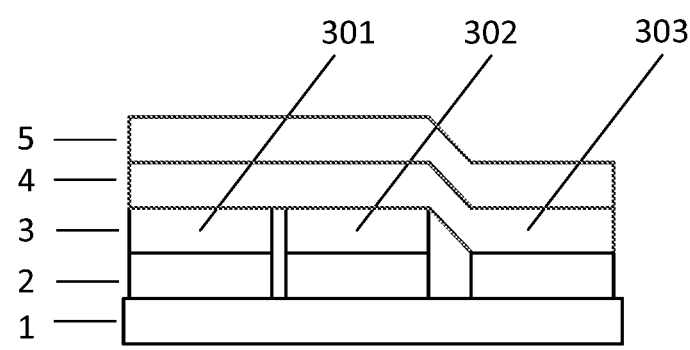
FIG. 1 is a structural schematic diagram of an organic electroluminescent device of the present invention.
Figure 2:
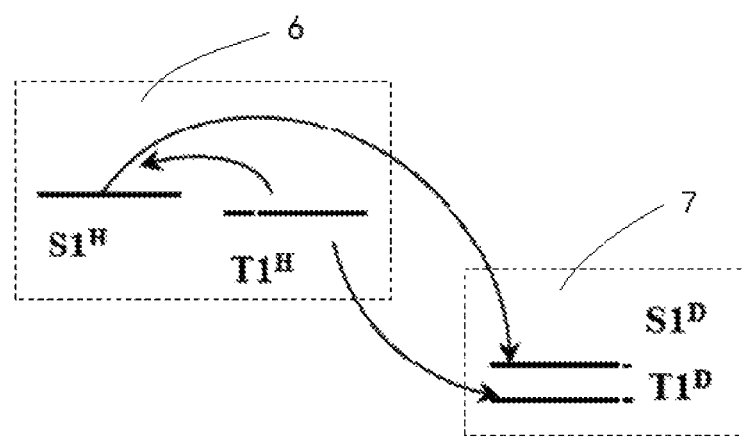
FIG. 2 is a mechanism diagram of the organic electroluminescent device of the present invention.

The reference numerals in the Drawings represent: 1—substrate, 2—first electrode, 3—first light—emitting layer, 4—second light—emitting layer, 5—second electrode, 6—host material, 7—guest material, 301—red light unit, 302—green light unit, 303—blue light unit.

DETAILED DESCRIPTION OF EMBODIMENTS

In order to make the objective, technical scheme and advantages of the present invention clearer, detailed description of embodiments of the present invention is further given below, with reference to the accompanying drawings.

The present invention can be implemented in many different forms and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is only defined by the claims. In the accompanying drawings, for the sake of clarity, dimensions and relative sizes of layers and areas might be exaggerated.

Embodiment 1

This embodiment provides an organic electroluminescent device, as shown in FIG. 1, comprising a first electrode 2, a first light-emitting layer 3, a second light-emitting layer 4 and a second electrode 5 stacked upon a substrate 1, wherein the first light-emitting layer 3 comprises red light units 301, green light units 302 and blue light units 303, which are arranged in the same layer, and the second light-emitting layer 4 is a blue light layer. In this embodiment, preferably, the blue light unit 303 in the first light-emitting layer 3 is formed by a part of the second light-emitting layer 4 extending into the first light-emitting layer 3, that is to say, the blue light unit 303 has the same material as that of the second light-emitting layer 4.

As an alternative embodiment of the present invention, the material of the blue light unit 303 may also be different from that of the second light-emitting layer 4, which can also achieve the purpose of the present invention and is also within the protection scope of the present invention.

As a preferred embodiment of the present invention, in the organic electroluminescent device, there are also functional layers such as a hole injection layer, a hole transport layer, an electron injection layer, an electron transport layer arranged between the first electrode 2 and the second electrode 5.

Specifically, in this embodiment, ITO (indium tin oxide) is adopted as an anode; HATCN is adopted as a hole injection layer; TCTA is adopted as a hole transport layer; the green light unit 302 adopts the TADF molecule of formula (1-103) as a host material (GH-1), and adopts $Tr(ppy)_3$ as a guest material (with a doping percentage of 10 wt %); the host material and guest material of the second light-emitting layer 4 are respectively BH-1 and BD-1 (with a doping percentage of 5 wt %); Bphen is adopted as an electron transport layer; LiF is adopted as an electron injection layer; Al is adopted as a cathode.

The green light unit structure is as follows: ITO/HAT-CN(7 nm)/NPB(50 nm)/TCTA(10 nm)/GH-1: 10% $Ir(ppy)_3$(30 nm)/BH-1: 5% BD-1 (25 nm)/Bphen(30 nm)/LiF(0.7 nm)/Al(150 nm). The green light unit 302 comprises a host material doped with a guest material, wherein the host material is a Thermal Activation Delayed Fluorescence (TADF) material having an energy level difference $\Delta E_{ST}$ that is less than 0.15 eV between triplet state and singlet state ($\Delta E_{ST}$ of (1-103) is 0.1 eV).

In the red light unit structure, except that the red light unit 301 is different from the green light unit 302, the other layers are the same. The red light host material of the red light unit 301 adopts a red light dye and $Ir(piq)_3$.

The red light unit structure is as follows: ITO/HAT-CN(7 nm)/NPB(50 nm)/TCTA(10 nm)/CBP: 5% $Ir(piq)_3$(30 nm)/BH-1: 5% BD-1(25 nm)/Bphen(30 nm)/LiF(0.7 nm)/Al(150 nm).

Embodiment 2

This embodiment provides an organic electroluminescent device with the same device structure as that of Embodiment 1, and the difference is that the host material of the red light unit 301 is the Thermal Activation Delayed Fluorescence material of formula (1-1) and the host material of the green light unit 302 is the Thermal Activation Delayed Fluorescence material of formula (1-2).

Embodiment 3

This embodiment provides an organic electroluminescent device with the same device structure as that of Embodiment 1, and the difference is that the host material of the green light unit 302 is the Thermal Activation Delayed Fluorescence material of formula (1-11).

Embodiment 4

This embodiment provides an organic electroluminescent device with the same device structure as that of Embodiment 1, and the difference is that the host material of the green light unit 302 is the Thermal Activation Delayed Fluorescence material of formula (1-19).

Embodiment 5

This embodiment provides an organic electroluminescent device with the same device structure as that of Embodiment 1, and the difference is that the host material of the green light unit 302 is the Thermal Activation Delayed Fluorescence material of formula (1-23).

Embodiment 6

This embodiment provides an organic electroluminescent device with the same device structure as that of Embodiment 1, and the difference is that the host material of the green light unit 302 is the Thermal Activation Delayed Fluorescence material of formula (1-26).

Embodiment 7

This embodiment provides an organic electroluminescent device with the same device structure as that of Embodiment 1, and the difference is that the host material of the green light unit 302 is the Thermal Activation Delayed Fluorescence material of formula (1-50).

Embodiment 8

This embodiment provides an organic electroluminescent device with the same device structure as that of Embodiment 1, and the difference is that the host material of the green light unit 302 is the Thermal Activation Delayed Fluorescence material of formula (1-54).

Embodiment 9

This embodiment provides an organic electroluminescent device with the same device structure as that of Embodiment 1, and the difference is that the host material of the green light unit 302 is the Thermal Activation Delayed Fluorescence material of formula (1-66).

Embodiment 10

This embodiment provides an organic electroluminescent device with the same device structure as that of Embodiment 1, and the difference is that the host material of the green light unit 302 is the Thermal Activation Delayed Fluorescence material of formula (1-90).

Comparison Example 1

As compared to Embodiment 1, the difference is the host material of the green light unit. In this comparison example, the green light unit adopts CBP as a green light host material, and the specific structure is as follows:
ITO/HAT-CN(7 nm)/NPB(50 nm)/TCTA(10 nm)/CBP: 10% Ir(ppy)$_3$(30 nm)/BH-1: 5% BD-1(25 nm)/Bphen(30 nm)/LiF (0.7 nm)/Al(150 nm).

Comparison Example 2

As compared to Embodiment 1, the difference is there is no blue light layer covering upon the red, green light units. The specific red light unit structure and green light unit structure are as follows:
green light unit structure: ITO/HATCN(7 nm)/NPB(50 nm)/TCTA(10 nm)/GH-1: 10% Ir(ppy)$_3$(30 nm)/Bphen(30 nm)/LiF(0.7 nm)/Al(150 nm);
red light unit structure: ITO/HAT-CN(7 nm)/NPB(50 nm)/TCTA(10 nm)/CBP:5% Ir(piq)$_3$(30 nm)/Bphen(30 nm)/LiF (0.7 nm)/Al(150 nm).

The structural formulas of the organic materials adopted in the embodiments and comparison examples are as follows:

| Abbreviation | structural formula |
|---|---|
| HAT-CN | |
| NPB | |

-continued

| Abbreviation | structural formula |
|---|---|
| TCTA | |
| CBP | |
| Ir(piq)3 | |

-continued

| Abbreviation | structural formula |
|---|---|
| Ir(ppy)3 | |
| Bphen | |
| GH-1 | |
| BH-1 (AND) | |
| BD-1 | |

Test Example

Tests are carried out on the organic electroluminescent devices of the above-mentioned Embodiments 1-10 and comparison examples, and the test results are listed in the table below:

| Serial Number | Brightness (cd/m$^2$) | Voltage (V) | Current efficiency (cd/A) | x (V) | y (V) |
|---|---|---|---|---|---|
| Embodiment 1 Green light | 1000.00 | 3.5 | 52 | 0.32 | 0.62 |
| Comparison example 1 Green light | 1000.00 | 3.7 | 20 | 0.23 | 0.44 |
| Comparison example 2 Green light | 1000.00 | 3.2 | 45 | 0.31 | 0.62 |
| Embodiment 1 Red light | 1000.00 | 4.7 | 15 | 0.66 | 0.33 |
| Comparison example 2 Red light | 1000.00 | 4.4 | 14 | 0.66 | 0.33 |
| Embodiment 2 Green light | 1000.00 | 3.6 | 50 | 0.32 | 0.61 |
| Embodiment 2 Red light | 1000.00 | 4.7 | 17 | 0.66 | 0.33 |
| Embodiment 3 Green light | 1000.00 | 3.6 | 49 | 0.32 | 0.61 |
| Embodiment 4 Green light | 1000.00 | 3.7 | 49 | 0.32 | 0.62 |
| Embodiment 5 Green light | 1000.00 | 3.6 | 51 | 0.32 | 0.62 |
| Embodiment 6 Green light | 1000.00 | 3.5 | 50 | 0.32 | 0.62 |
| Embodiment 7 Green light | 1000.00 | 3.5 | 46 | 0.32 | 0.61 |
| Embodiment 8 Green light | 1000.00 | 3.6 | 47 | 0.32 | 0.61 |
| Embodiment 9 Green light | 1000.00 | 3.6 | 47 | 0.32 | 0.62 |
| Embodiment 10 Green light | 1000.00 | 3.5 | 49 | 0.32 | 0.61 |

Thus it can be seen that, the green light spectrum and red light spectrum of the organic electroluminescent devices in Embodiments 1-10 do not contain blue light.

As can be seen from the green light tests on Embodiment 1 and Comparison example 1, using a non-TADF green-light host material in the green light unit 302 would cause a blue light component to appear in the green light spectrum; on the other hand, introducing a TADF green-light host material can narrow the carrier recombination region, so that the green light spectrum does not contain a blue light component.

As can be seen from the green light tests on Embodiment 1 and Comparison example 2, adding a blue light layer upon the green light unit 302 that has a TADF green-light host material would not influence the current efficiency or chroma of the green light unit itself, and no blue light component would appear in the green light spectrum. Introducing a blue light layer would slightly increase the operation voltage of the green light unit.

As can be seen from the red light tests on Embodiment 1 and Comparison example 2, adding a blue light layer upon the red light unit 301 would not influence the current efficiency or chroma of the red light unit 301 itself, and no blue light component would appear in the red light spectrum. Introducing a blue light layer would slightly increase the operation voltage of the red light unit.

As can be seen from the red light tests on Embodiment 2 and Comparison example 2, the red light unit 301 adopts a Thermal Activation Delayed Fluorescence material as its host material, and adding a blue light layer upon the red light unit 301 would not influence the chroma of the red light unit 301 itself, while the operation voltage of the red light unit is slightly increased. When the red light unit 301 adopts a Thermal Activation Delayed Fluorescence material as its host material, the red light-emitting efficiency is increased to a certain extent.

Apparently, the aforementioned embodiments are merely examples illustrated for clearly describing the present invention, rather than limiting the implementation ways thereof. For a person skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

The invention claimed is:

1. An organic electroluminescent device, comprising a first electrode, a first light-emitting layer, a second light-emitting layer and a second electrode stacked upon a substrate;

wherein the first light-emitting layer comprises red light units, green light units and blue light units, which are arranged in the same layer, the second light-emitting layer is a blue light layer, the green light unit comprises a host material doped with a guest material, wherein the host material at least includes a Thermal Activation Delayed Fluorescence (TADF) material having a structure selected from the following formulas (1-90) to (1-100):

1-90

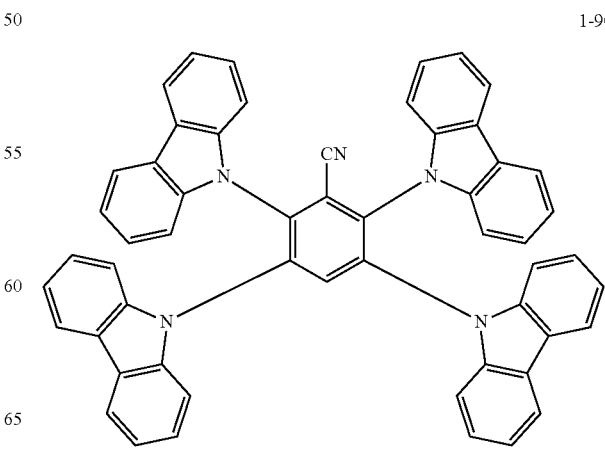

-continued
1-91
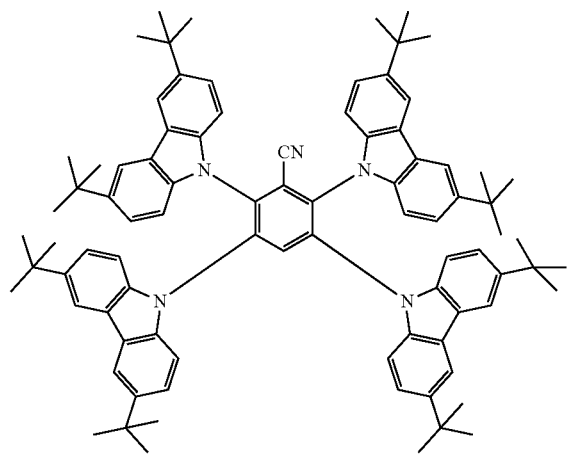
1-92
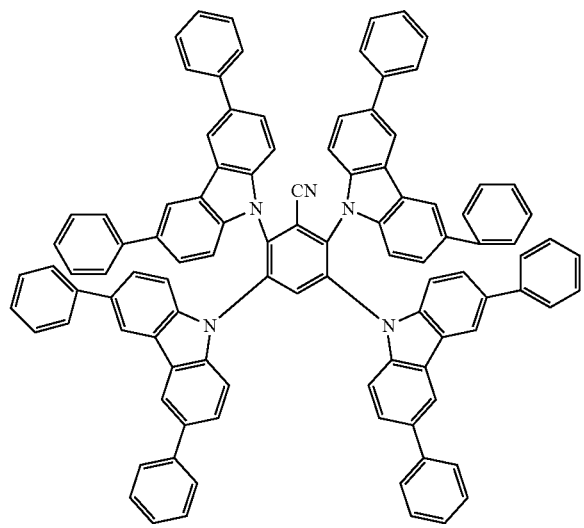
1-93
-continued
1-94
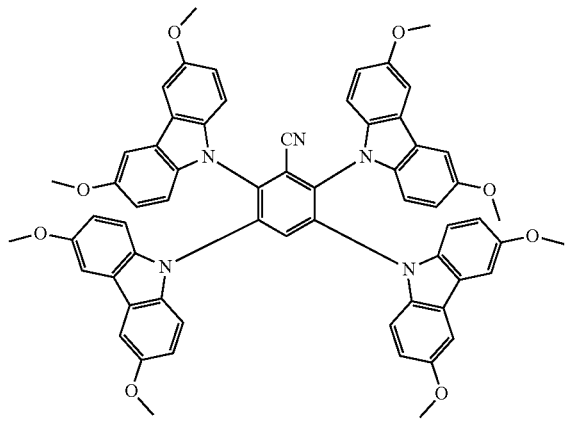
1-95
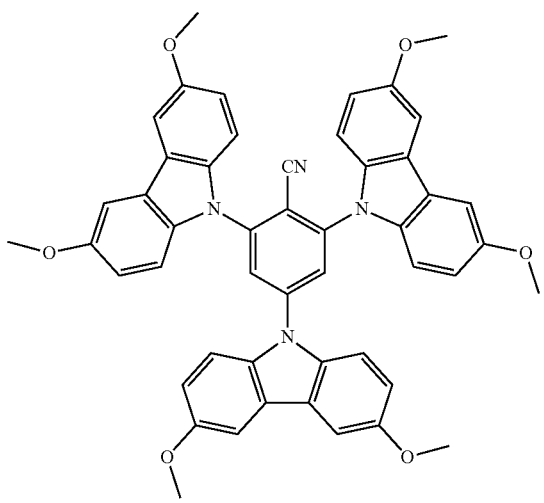
1-96
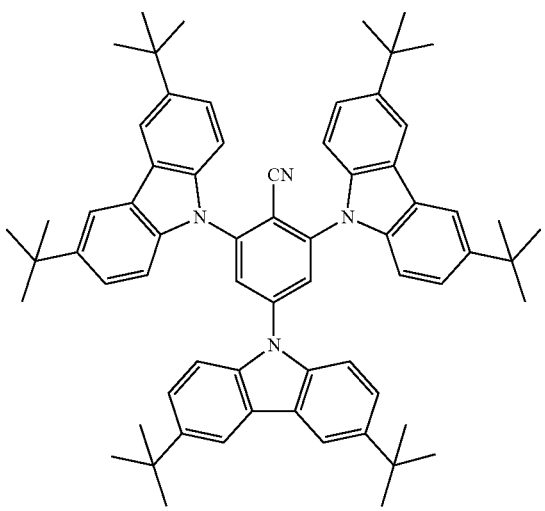

1-97

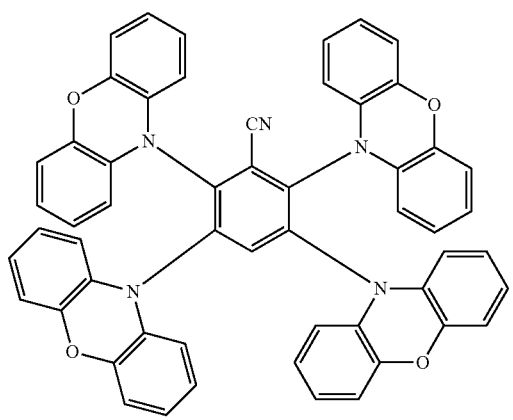

1-98

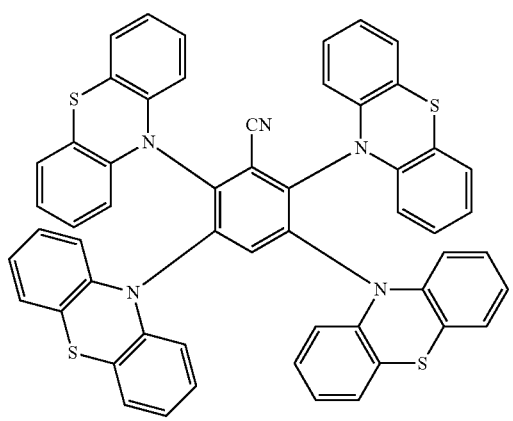

1-99

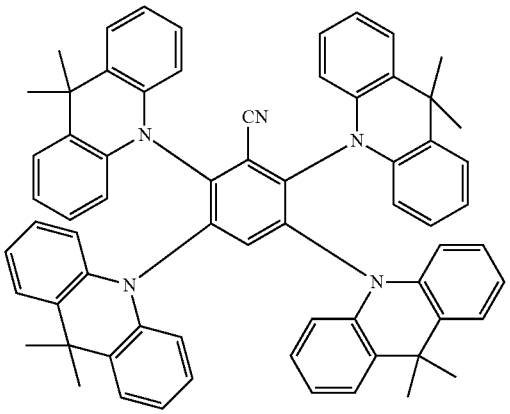

1-100

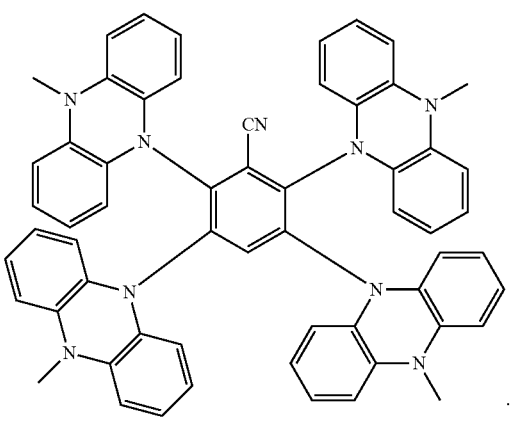

2. The organic electroluminescent device according to claim 1, the blue light unit in the first light-emitting layer is formed by a part of the second light-emitting layer extending into the first light-emitting layer.

3. The organic electroluminescent device according to claim 1, the red light unit comprises phosphorescent material; the blue light unit comprises fluorescent material; and the blue light layer comprises fluorescent material.

* * * * *